United States Patent
Hatakeyama et al.

(10) Patent No.: US 6,623,909 B2
(45) Date of Patent: Sep. 23, 2003

(54) POLYMERS, RESIST COMPOSITIONS AND PATTERNING PROCESS

(75) Inventors: Jun Hatakeyama, Nakakubiki-gun (JP); Toshiaki Takahashi, Nakakubiki-gun (JP); Toshinobu Ishihara, Nakakubiki-gun (JP); Jun Watanabe, Nakakubiki-gun (JP); Tohru Kubota, Nakakubiki-gun (JP); Yoshio Kawai, Nakakubiki-gun (JP)

(73) Assignee: Shin-Etsu Chemical Co., Ltd., Chiyoda-Ku (JP)

( * ) Notice: Subject to any disclaimer, the term of this patent is extended or adjusted under 35 U.S.C. 154(b) by 103 days.

(21) Appl. No.: 09/870,745

(22) Filed: Jun. 1, 2001

(65) Prior Publication Data

US 2002/0012871 A1 Jan. 31, 2002

(30) Foreign Application Priority Data

Jun. 2, 2000 (JP) .......................... 2000-165884
Jun. 2, 2000 (JP) .......................... 2000-165895

(51) Int. Cl.$^7$ ............................. G03F 7/038; G03F 7/26
(52) U.S. Cl. ............... 430/270.1; 430/296; 430/313; 430/323; 430/326; 430/327; 430/328; 430/330; 430/905; 430/907; 528/33; 528/36
(58) Field of Search .................. 528/33, 36; 430/270.1, 430/296, 323, 313, 326, 327, 328, 330, 905, 907

(56) References Cited

U.S. PATENT DOCUMENTS

2002/0081520 A1 * 6/2002 Sooriyakumaran et al. ............ 430/270.1

FOREIGN PATENT DOCUMENTS

| JP | 63-27829 | 2/1988 |
| JP | 2-27660 | 6/1990 |
| JP | 9-73173 | 3/1997 |
| JP | 9-230595 | 9/1997 |
| JP | 10-10739 | 1/1998 |
| WO | WO 97/33198 | 9/1997 |

* cited by examiner

Primary Examiner—Janet Baxter
Assistant Examiner—Barbara Gilliam
(74) Attorney, Agent, or Firm—Millen, White, Zelano & Branigan, P.C.

(57) ABSTRACT

Polymers comprising recurring units of formula (1) are provided wherein $R^1$ is a straight, branched or cyclic divalent $C_{1-20}$ hydrocarbon group or a bridged cyclic hydrocarbon group, R is hydrogen atom or an acid labile group, $0 \leq m \leq 3$, $0 \leq n \leq 3$ and $0 \leq m+n \leq 6$.

(1)

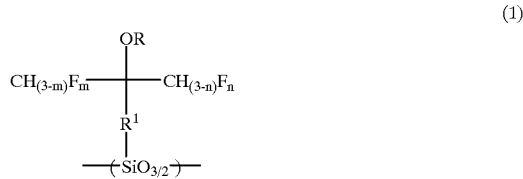

Using the polymers, chemical amplification positive resist compositions featuring low absorption of $F_2$ excimer laser light are obtained.

20 Claims, No Drawings

POLYMERS, RESIST COMPOSITIONS AND PATTERNING PROCESS

This invention relates to polymers useful as the base polymer in resist compositions suited for microfabrication, especially chemical amplification resist compositions. It also relates to resist compositions comprising the polymers, and a patterning process using the same.

BACKGROUND OF THE INVENTION

In the drive for higher integration and operating speeds in LSI devices, the pattern rule is made drastically finer. The rapid advance toward finer pattern rules is grounded on the development of a projection lens with an increased NA, a resist material with improved performance, and exposure light of a shorter wavelength. In particular, the change-over from i-line (365 nm) to shorter wavelength KrF excimer laser (248 nm) brought about a significant innovation, enabling mass-scale production of 0.18 micron rule devices. To the demand for a resist material with a higher resolution and sensitivity, acid-catalyzed chemical amplification positive working resist materials are effective as disclosed in U.S. Pat. No. 4,491,628 and U.S. Pat. No. 5,310,619 (JP-B 2-27660 and JP-A 63-27829). They now become predominant resist materials especially adapted for deep UV lithography.

Resist materials adapted for KrF excimer lasers enjoyed early use on the 0.3 micron process, went through the 0.25 micron rule, and currently entered the mass production phase on the 0.18 micron rule. Engineers have started investigation on the 0.15 micron rule, with the trend toward a finer pattern rule being accelerated. A wavelength change-over from KrF to shorter wavelength ArF excimer laser (193 nm) is expected to enable miniaturization of the design rule to 0.13 μm or less. Since conventionally used novolac resins and polyvinylphenol resins have very strong absorption in proximity to 193 nm, they cannot be used as the base resin for resists. To ensure transparency and dry etching resistance, some engineers investigated acrylic and alicyclic (typically cycloolefin) resins as disclosed in JP-A 9-73173, JP-A 10-10739, JP-A 9-230595 and WO 97/33198.

With respect to $F_2$ excimer laser (157 nm) which is expected to enable further miniaturization to 0.10 μm or less, more difficulty arises in insuring transparency because it was found that acrylic resins are not transmissive to light at all and those cycloolefin resins having carbonyl bonds have very low light transmittance. It is known from Critical issues in 157 nm lithography: T. M. Bloomstein et al., J. Vac. Sci. Technol. B 16(6), November/December 1998, that siloxane polymers and silsesquioxane polymers are more advantageous for light transmission improvement. These polymers have a possibility to use as the resist base resin from which a multilayer resist pattern is formed using an oxygen plasma. If they have a high dry etching selectivity, it is believed that this, combined with a possibility of slimming as compared with conventional resists, considerably mitigates the burden associated with light transmission.

However, those polymers having phenol groups introduced for enhancing the dissolution contrast to alkali have a window for light absorption in proximity to a wavelength of 160 nm, so the absorption is somewhat improved, but far below the practical level. Those polymers having carboxylic acid introduced are further reduced in light transmittance because of light absorption based on carbonyl groups. It was found in conjunction with single layer resists that reducing carbon-to-carbon unsaturated bonds as typified by benzene rings and carbon-to-oxygen double bonds as typified by carbonyl groups is essential for insuring a light transmittance (see International Work Shop 157 nm Lithography MIT-LL, Boston, Mass., May 5, 1999). Because of an ability to form a thin film, silicone-containing polymers are advantageous in light transmittance over single layer resists, but yet required to essentially increase light transmittance in order to increase the resolution.

SUMMARY OF THE INVENTION

An object of the invention is to provide a novel polymer having a high transmittance to an excimer laser beam in the vacuum ultraviolet region corresponding to a wavelength of up to 300 nm, especially an $F_2$ excimer laser (157 nm), $Kr_2$ excimer laser (146 nm), KrAr excimer laser (134 nm) and $Ar_2$ excimer laser (121 nm), and EUV (8–13 nm), and useful as the base polymer in a resist composition, especially chemical amplification resist composition. Another object is to provide a resist composition, especially chemical amplification resist composition comprising the polymer, and a patterning process using the same.

Based on the belief that a fluorinated alcohol is compliant with both light transmittance and etching resistance, the inventor attempted to introduce a fluorinated alcohol into a silicone-containing polymer. The inventor has found that a resist composition having light transmittance and etching resistance is obtained using a resin based on a polysilsesquioxane containing a fluorinated alcohol partially substituted with acid labile groups.

In a first aspect, the invention provides a polymer comprising recurring units of the following general formula (1).

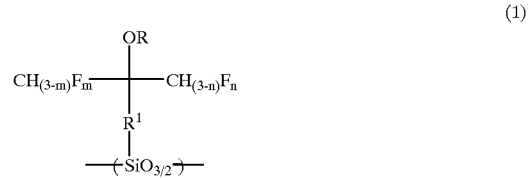

wherein $R^1$ is a straight, branched or cyclic divalent hydrocarbon group of 1 to 20 carbon atoms or a bridged cyclic hydrocarbon group, R is hydrogen atom or an acid labile group, and letters m and n are in the range: $0 \leq m \leq 3$, $0 \leq n \leq 3$ and $1 \leq m+n \leq 6$.

In a second aspect, the invention also provides a polymer comprising recurring units of the following general formula (2).

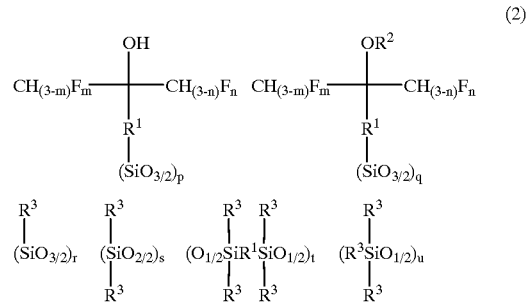

wherein $R^1$ is a straight, branched, cyclic or bridged cyclic divalent hydrocarbon group of 1 to 20 carbon atoms, $R^2$ is an acid labile group, $R^3$ is a straight, branched or cyclic, substituted or unsubstituted, monovalent hydrocarbon group of 1 to 20 carbon atoms, and letters m, n, p, q, r, s, t, and u are in the range: $0 \leq m \leq 3$, $0 \leq n \leq 3$, $0 < p < 1$, $0 < q < 1$, $0 \leq r < 1$, $0 \leq s < 1$, $0 \leq t < 1$, $0 \leq u < 1$, $1 \leq m+n \leq 6$, and $p+q+r+s+t+u=1$.

In a third aspect, the invention provides a resist composition comprising the polymer of formula (1) or (2).

In a fourth aspect, the invention provides a chemical amplification, positive resist composition comprising (A) the polymer of formula (1) or (2), (B) an organic solvent, and (C) a photoacid generator. The resist composition may further include (D) a basic compound and/or (E) a dissolution inhibitor.

In a fifth aspect, the invention provides a process for forming a pattern, comprising the steps of applying the resist composition defined above onto a substrate to form a coating; heat treating the coating and exposing the coating to high energy radiation with a wavelength of up to 300 nm or electron beam through a photo-mask; optionally heat treating the exposed coating, and developing the coating with a developer.

Also provided is a process for forming a multilayer resist pattern, comprising the steps of forming a pattern according to the above process, and etching the pattern with an oxygen plasma to be ready for further processing.

DESCRIPTION OF THE PREFERRED EMBODIMENT

Polymer

According to the invention, the polymers or high molecular weight compounds are defined as comprising recurring units of the following general formula (1) or (2).

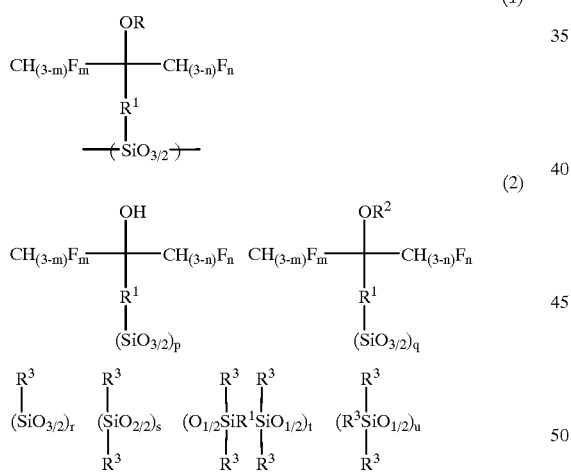

wherein $R^1$ is a straight, branched, cyclic or bridged cyclic divalent hydrocarbon group of 1 to 20 carbon atoms, R is hydrogen atom or an acid labile group, $R^2$ is an acid labile group, $R^3$ is a straight, branched or cyclic, substituted or unsubstituted, monovalent hydrocarbon group of 1 to 20 carbon atoms, and letters m, n, p, q, r, s, t, and u are in the range: $0 \leq m \leq 3$, $0 \leq n \leq 3$, $0 < p < 1$, $0 < q < 1$, $0 \leq r < 1$, $0 \leq s < 1$, $0 \leq t < 1$, $0 < u < 1$, $1 \leq m+n \leq 6$, and $p+q+r+s+t+u=1$.

Herein $R^1$ is a straight, branched, cyclic or bridged cyclic divalent hydrocarbon group of 1 to 20 carbon atoms, preferably 2 to 16 carbon atoms, typically alkylene group. Illustrative examples of $R^1$ include methylene, ethylene, propylene, butylene, cyclopentylene, and cyclohexylene as well as the groups shown below.

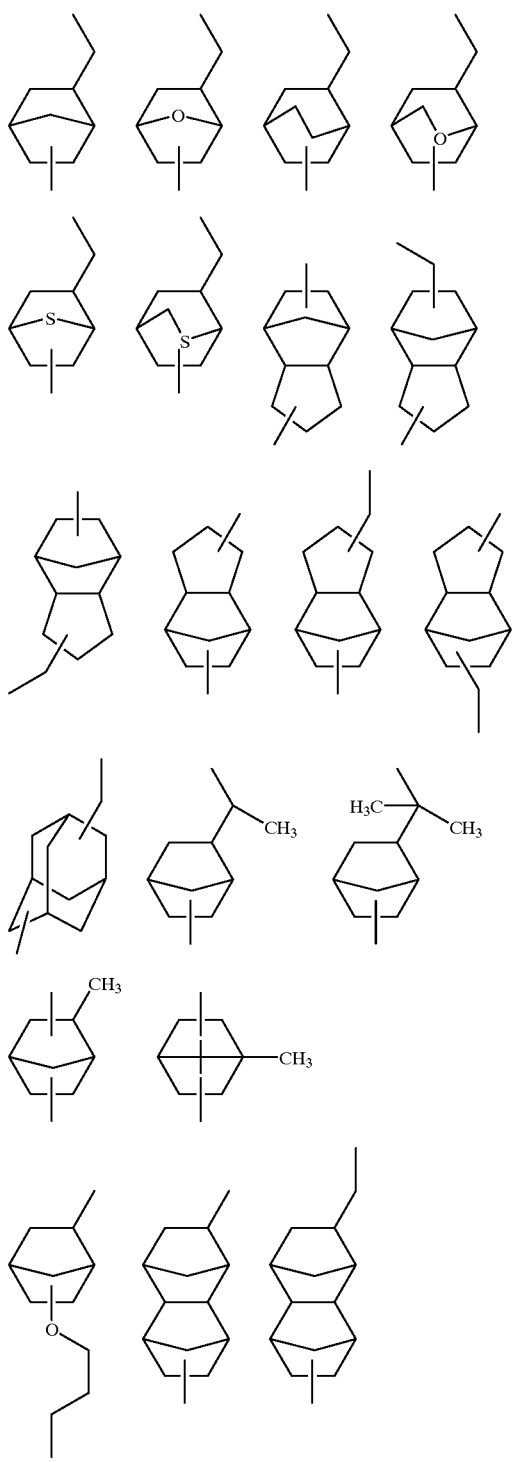

In the inventive polymers, the acid labile group represented by R and $R^2$ is selected from a variety of such groups, preferably from among the groups of the following formulae (3) and (4), tertiary alkyl groups of 4 to 40 carbon atoms represented by the following formula (5), trialkylsilyl groups whose alkyl groups each have 1 to 6 carbon atoms, and oxoalkyl groups of 4 to 20 carbon atoms.

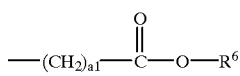 (3)

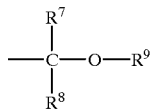 (4)

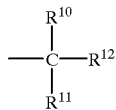 (5)

In formula (3), $R^6$ is a tertiary alkyl group of 4 to 20 carbon atoms, preferably 4 to 15 carbon atoms, a trialkylsilyl group whose alkyl groups each have 1 to 6 carbon atoms, an oxoalkyl group of 4 to 20 carbon atoms or a group of formula (4). Exemplary tertiary alkyl groups are tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter $a_1$ is an integer of 0 to 6.

In formula (4), $R^7$ and $R^8$ are independently hydrogen or straight, branched or cyclic alkyl groups of 1 to 18 carbon atoms, preferably 1 to 10 carbon atoms, for example, methyl, ethyl, propyl, isopropyl, n-butyl, sec-butyl, tert-butyl, cyclopentyl, cyclohexyl, 2-ethylhexyl and n-octyl. $R^9$ is a monovalent hydrocarbon group of 1 to 18 carbon atoms, preferably 1 to 10 carbon atoms, which may have a hetero atom (e.g., oxygen atom), for example, straight, branched or cyclic alkyl groups, and such groups in which some hydrogen atoms are replaced by hydroxyl, alkoxy, oxo, amino or alkylamino groups. Illustrative examples of the substituted alkyl groups are given below.

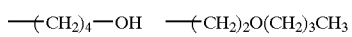

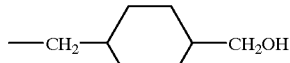

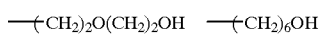

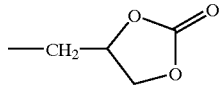

A pair of $R^7$ and $R^8$, a pair of $R^7$ and $R^9$, or a pair of $R^8$ and $R^9$, taken together, may form a ring. Each of $R^7$, $R^8$ and $R^9$ is a straight or branched alkylene group of 1 to 18 carbon atoms, preferably 1 to 10 carbon atoms, when they form a ring.

Illustrative examples of the acid labile groups of formula (3) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Of the acid labile groups of formula (4), illustrative examples of the straight or branched groups are given below.

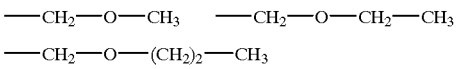

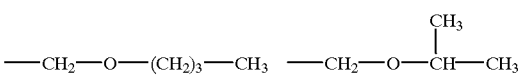

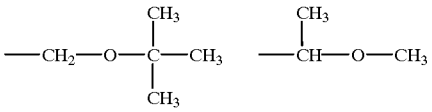

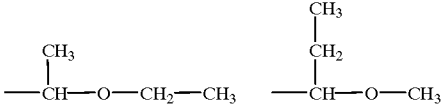

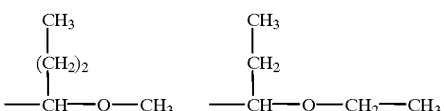

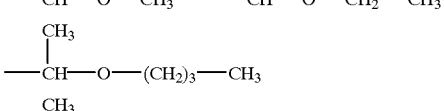

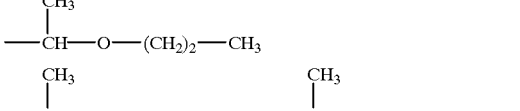

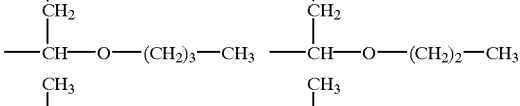

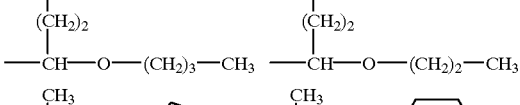

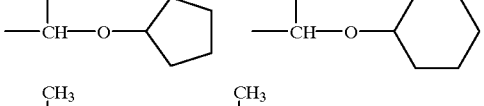

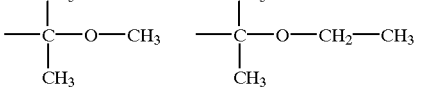

Of the acid labile groups of formula (4), illustrative examples of the cyclic groups include tetrahydrofuran-2-yl, 2-methyltetrahydrofuran-2-yl, tetrahydropyran-2-yl and 2-methyltetrahydropyran-2-yl. Preferred among the groups of formula (4) are ethoxyethyl, butoxyethyl and ethoxypropyl.

In formula (5), $R^{10}$, $R^{11}$ and $R^{12}$ are independently monovalent hydrocarbon groups, for example, straight, branched or cyclic alkyl groups of 1 to 20 carbon atoms, which may contain a hetero atom such as oxygen, sulfur, nitrogen or fluorine. A pair of $R^{10}$ and $R^{11}$, a pair of $R^{10}$ and $R^{12}$, or a pair of $R^{11}$ and $R^{12}$, taken together, may form a ring.

Examples of the tertiary alkyl group represented by formula (5) include tert-butyl, triethylcarbyl, 1-ethylnorbornyl, 1-methylcyclohexyl, 1-ethylcyclopentyl, 2-(2-methyl)adamantyl, 2-(2-ethyl)adamantyl, and tert-amyl.

Other illustrative examples of the tertiary alkyl group are given below as formulae (5-1) through (5-15).

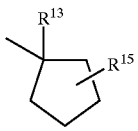 (5)-1

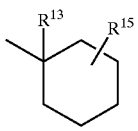 (5)-2

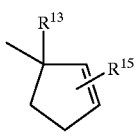 (5)-3

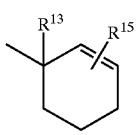 (5)-4

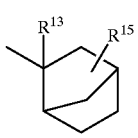 (5)-5

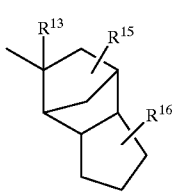 (5)-6

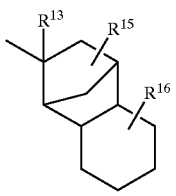 (5)-7

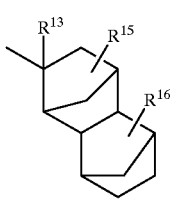 (5)-8

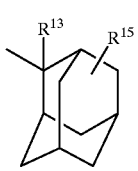 (5)-9

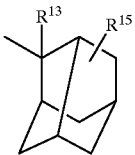 (5)-10

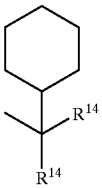 (5)-11

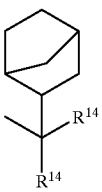 (5)-12

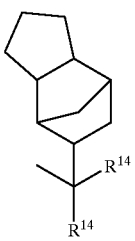 (5)-13

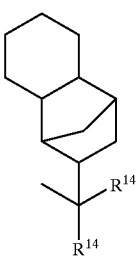 (5)-14

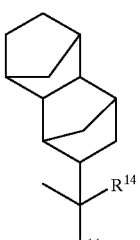 (5)-15

Herein, $R^{13}$ and $R^{14}$ are independently straight, branched or cyclic alkyl groups of 1 to 6 carbon atoms, for example, methyl, ethyl, propyl, isopropyl, n-butyl, sec-butyl, n-pentyl, n-hexyl, cyclopropyl, cyclopropylmethyl and cyclohexyl. $R^{15}$ is hydrogen or a monovalent hydrocarbon group of 1 to 6 carbon atoms which may contain a hetero atom or a monovalent hydrocarbon group of 1 to 6 carbon atoms, typically alkyl, which may be separated by a hetero atom. The hetero atom is an oxygen, sulfur or nitrogen atom, which is contained or intervenes in the form of —OH, —OR, —O—, —S—, —S(=O)—, —NH$_2$, —NHR, —NR$_2$, —NH, or —NR— wherein R is an alkyl group of 1 to 20 carbon atoms, and especially 1 to 16 carbon atoms.

R$^{16}$ is hydrogen or an alkyl, hydroxyalkyl, alkoxyalkyl, alkoxy or alkoxyalkoxy group of 1 to 20 carbon atoms, especially 1 to 16 carbon atoms, which may be straight, branched or cyclic. Illustrative examples include methyl, hydroxymethyl, ethyl, hydroxyethyl, propyl, isopropyl, n-butyl, sec-butyl, n-pentyl, n-hexyl, methoxy, methoxymethoxy, ethoxy, and tert-butoxy.

Of the acid labile group represented by R$^2$, the trialkylsilyl groups whose alkyl groups each have 1 to 6 carbon atoms include trimethylsilyl, triethylsilyl, and tert-butyldimethylsilyl.

The oxoalkyl groups of 4 to 20 carbon atoms include 3-oxocyclohexyl and groups of the following formulae.

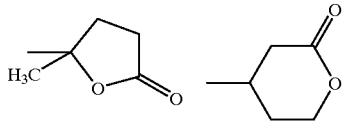

Alternatively, the acid labile group represented by R and R$^2$ may be an acid labile group or crosslinking group of the following general formula (6a) or (6b). In this embodiment, the polymer is crosslinked between molecules or within a molecule with the crosslinking groups.

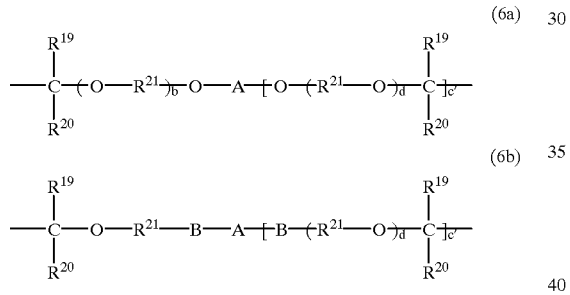

Herein, R$^{19}$ and R$^{20}$ each are hydrogen or a straight, branched or cyclic alkyl group of 1 to 8 carbon atoms, or R$^{19}$ and R$^{20}$, taken together, may form a ring, with the proviso that each of R$^{19}$ and R$^{20}$ is a straight or branched alkylene group of 1 to 8 carbon atoms when they form a ring. R$^{21}$ is a straight, branched or cyclic alkylene group of 1 to 10 carbon atoms. Letter b and d each are 0 or an integer of 1 to 10, preferably 0 or an integer of 1 to 5. A is a c-valent aliphatic or alicyclic saturated hydrocarbon group, aromatic hydrocarbon group or heterocyclic group of 1 to 50 carbon atoms, which may have an intervening hetero atom and in which the hydrogen atom attached to a carbon atom may be partially replaced by a hydroxyl group, carboxyl group, carbonyl group or fluorine atom. B is —CO—O—, —NHCO—O— or —NHCONH—. Letter c is an integer of 2 to 8, and c' is an integer of 1 to 7.

Preferably, A is a di- to tetra-valent straight, branched or cyclic alkylene, alkyltriyl or alkyltetrayl group of 1 to 20 carbon atoms or arylene group of 6 to 30 carbon atoms, which may have an intervening hetero atom and in which the hydrogen atom attached to a carbon atom may be partially replaced by a hydroxyl group, carboxyl group, acyl group or halogen atom. Letter c' is preferably an integer of 1 to 3.

As understood from the value of c' in formula (6a) or (6b), the crosslinking group is not limited to a divalent one and trivalent to octavalent groups are acceptable. For example, the divalent crosslinking group is exemplified by groups of the following formulas (6a') and (6b'), and the trivalent crosslinking group is exemplified by groups of the following formulas (6a") and (6b").

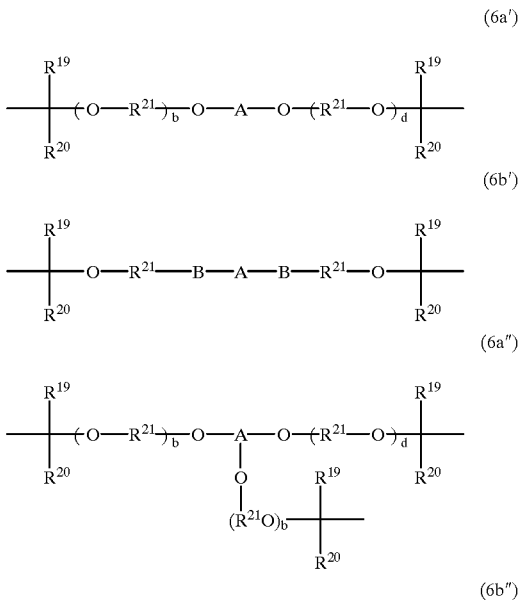

"A" in the crosslinking group is described in more detail. The (c+1)-valent organic groups represented by A include hydrocarbon groups, for example, substituted or unsubstituted alkylene groups having 1 to 50 carbon atoms, especially 1 to 40 carbon atoms, substituted or unsubstituted arylene groups having 6 to 50 carbon atoms, more preferably 6 to 40 carbon atoms, especially 6 to 20 carbon atoms, a combination of an alkylene group and an arylene group, and a'-valent groups obtained by eliminating one hydrogen atom attached to a carbon atom from the foregoing groups wherein a' is an integer of 3 to 8; and (a+1)-valent heterocyclic groups, and a combination of such a heterocyclic group with any one of the foregoing hydrocarbon groups. In the alkylene and arylene groups, a hetero atom such as O, NH, N(CH$_3$), S and SO$_2$ may intervene and where substituted, the substituent is a hydroxyl, carboxyl, acyl group or fluorine.

Illustrative examples of A are given below.

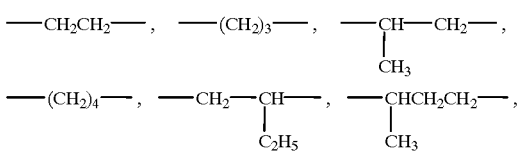

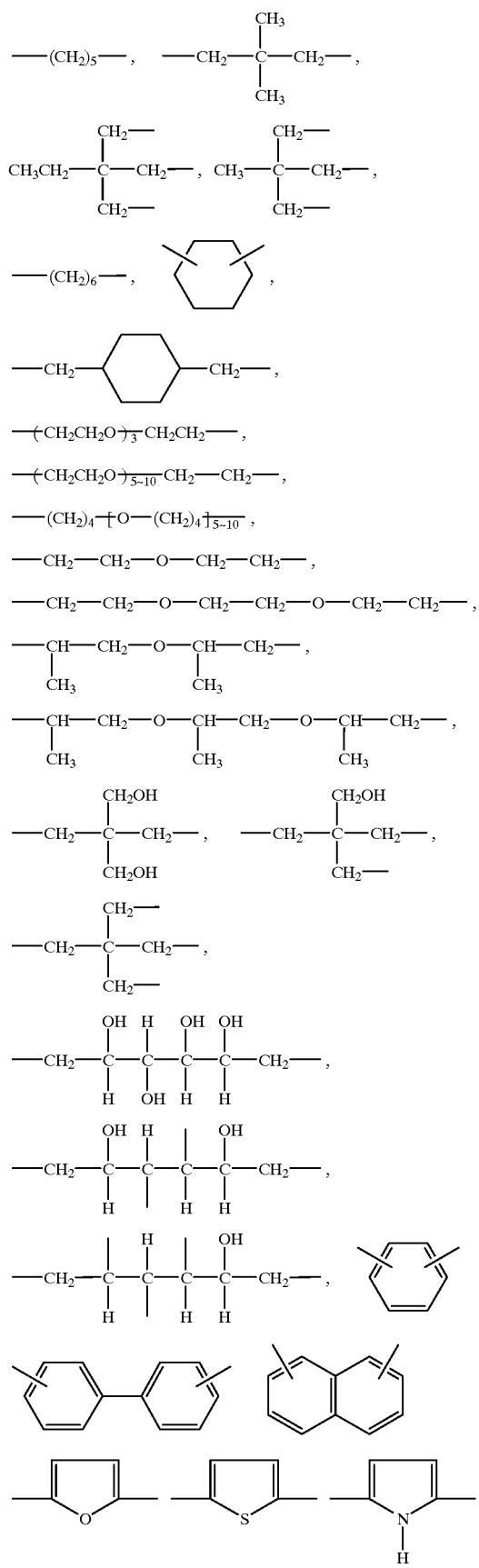
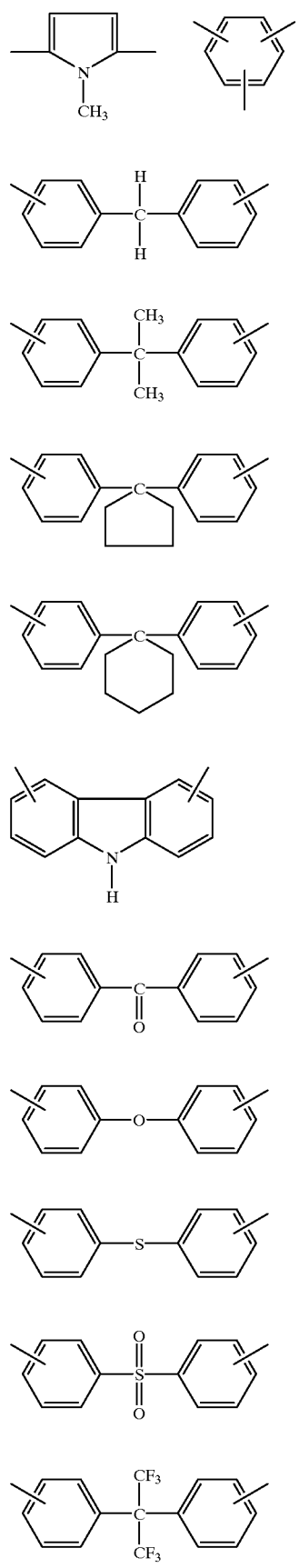

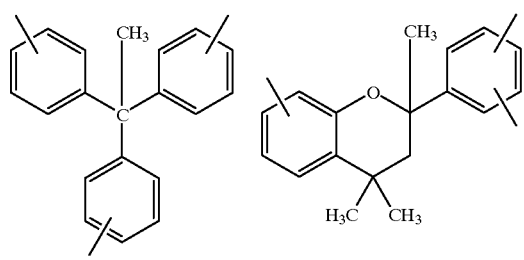
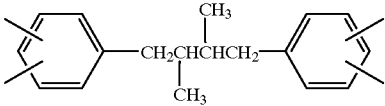
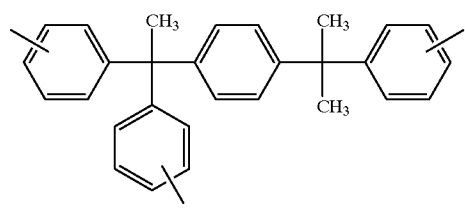
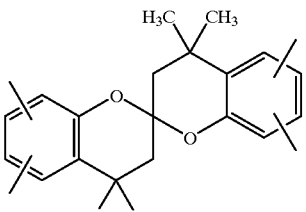
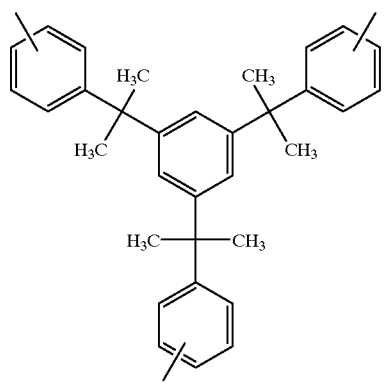
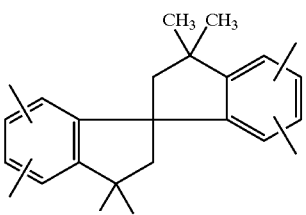
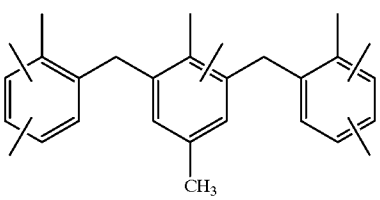
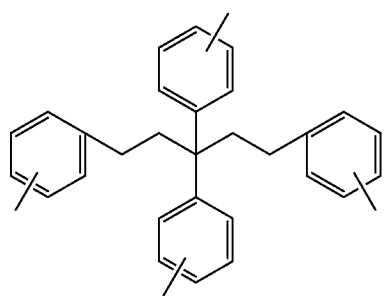
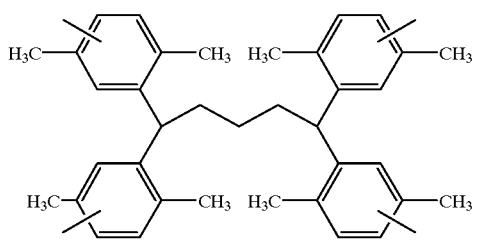

Preferably, in formula (6a), $R^{19}$ is methyl, $R^{20}$ is hydrogen, b is 0, and A is ethylene, 1,4-butylene or 1,4-cyclohexylene.

The polymer which is crosslinked between molecules and/or within a molecule with crosslinking groups having C—O—C linkages can be synthesized by reacting a corresponding uncrosslinked polymer with an alkenyl ether in the presence of an acid catalyst in a conventional way.

Where decomposition of other acid labile groups takes place under the acid catalyzed condition, the alkenyl ether is previously reacted with hydrochloric acid or the like to form a halogenated alkyl ether, which is reacted with the uncrosslinked polymer under basic conditions in a conventional way, obtaining the end product.

Illustrative, non-limiting examples of the alkenyl ether include ethylene glycol divinyl ether, triethylene glycol divinyl ether, 1,2-propanediol divinyl ether, 1,3-propanediol divinyl ether, 1,3-butanediol divinyl ether, 1,4-butanediol divinyl ether, tetramethylene glycol divinyl ether, neopentyl glycol divinyl ether, trimethylolpropane trivinyl ether, trimethylolethane trivinyl ether, hexanediol divinyl ether, 1,4-cyclohexanediol divinyl ether, 1,4-divinyloxymethyl cyclohexane, tetraethylene glycol divinyl ether, pentaerythritol divinyl ether, pentaerythritol trivinyl ether, pentaerythritol tetravinyl ether, sorbitol tetravinyl ether, sorbitol pentavinyl ether, ethylene glycol diethylene vinyl ether, triethylene glycol diethylene vinyl ether, ethylene glycol dipropylene vinyl ether, triethylene glycol diethylene vinyl ether, trimethylolpropane triethylene vinyl ether, trimethylolpropane diethylene vinyl ether, pentaerythritol diethylene vinyl ether, pentaerythritol triethylene vinyl ether, pentaerythritol tetraethylene vinyl ether, and compounds of the formulas (I-1) to (I-31) given below.

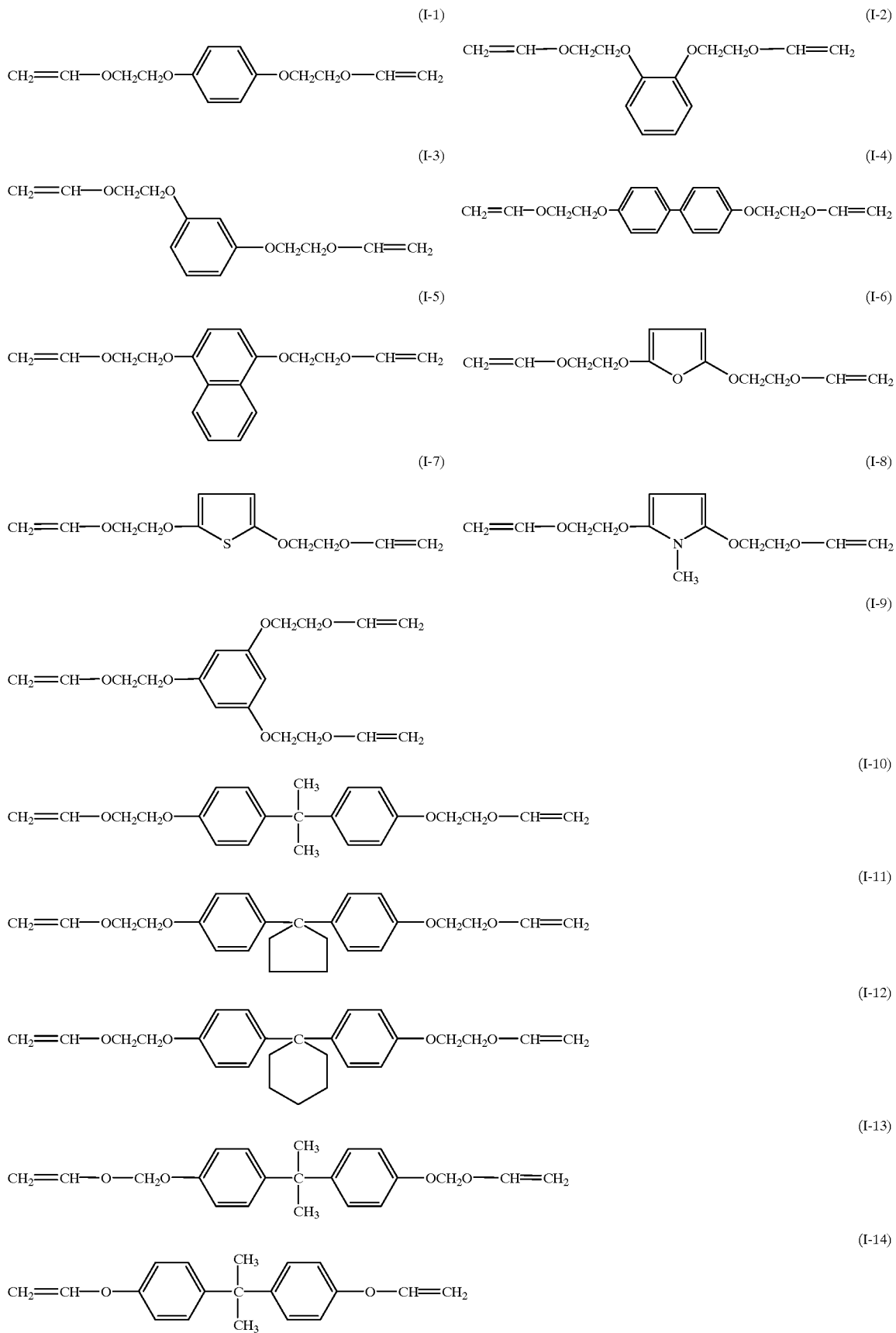

-continued
(I-15)
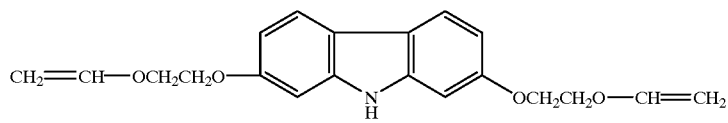
(I-16)
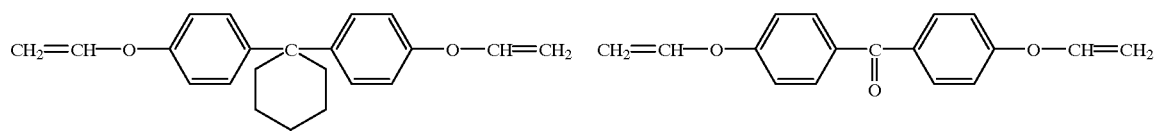
(I-17)
(I-18)
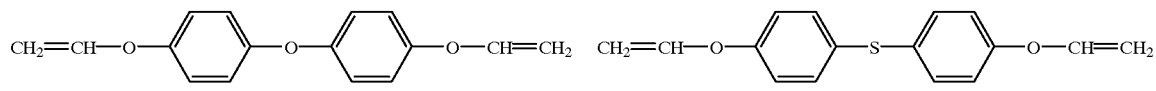
(I-19)
(I-20)
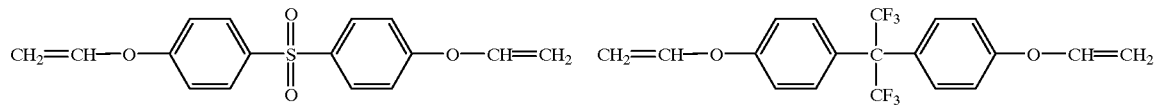
(I-21)
(I-22)
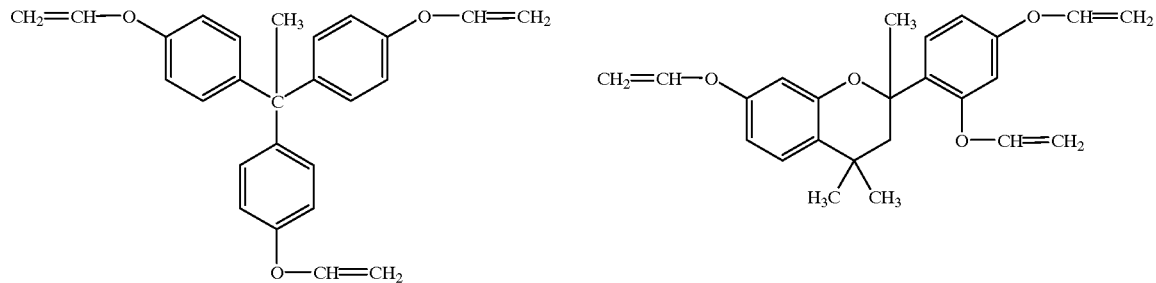
(I-23)
(I-24)
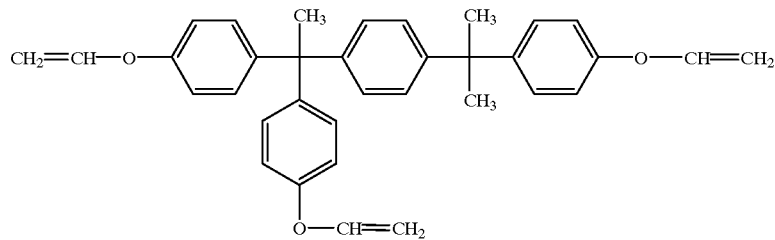
(I-25)
(I-26)
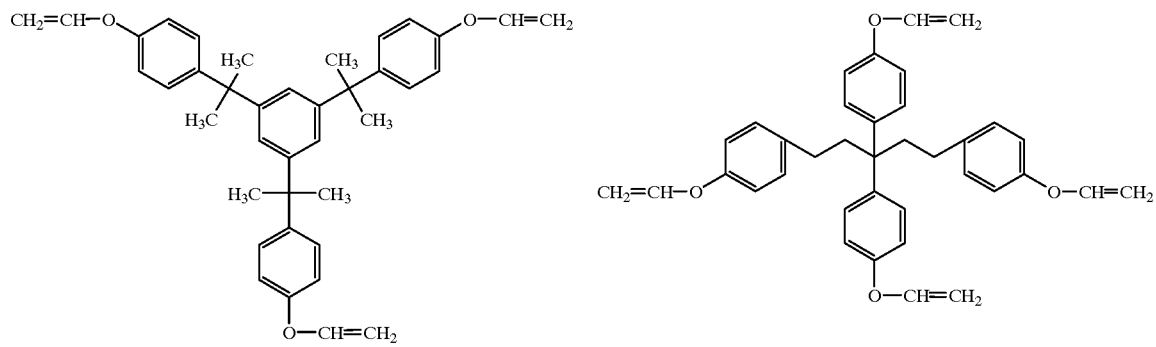

(I-27) 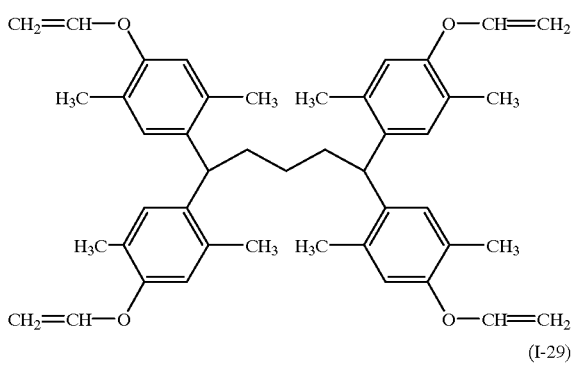

(I-28) 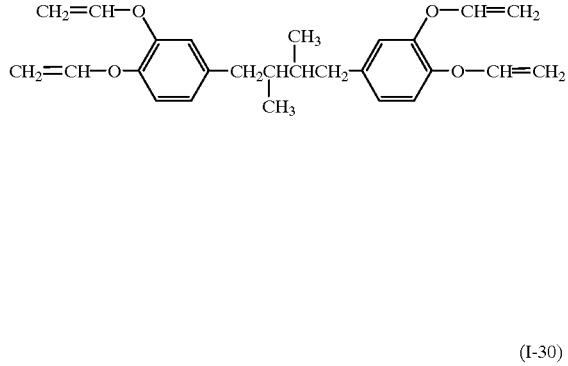

(I-29) (I-30) (I-31)
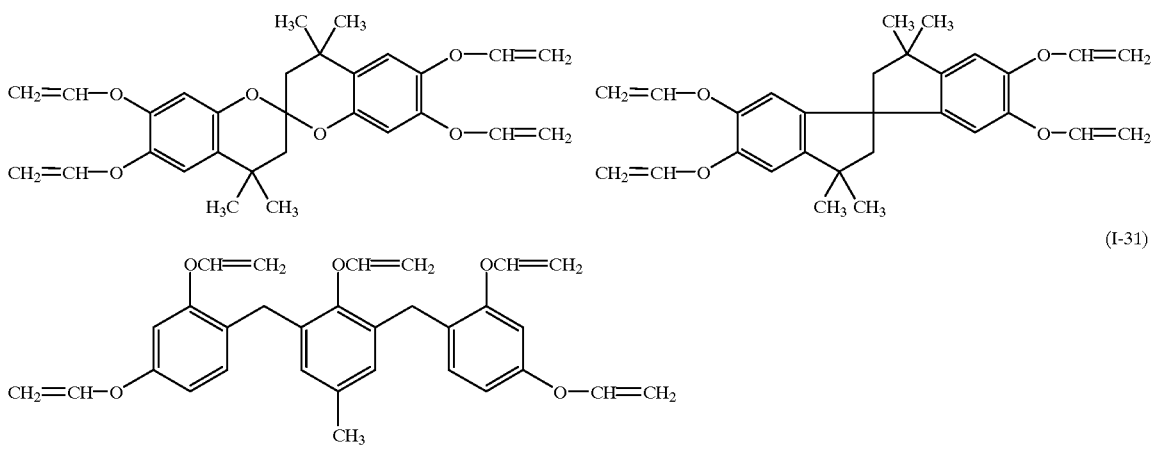

Also included are diethylene vinyl ether terephthalate, diethylene vinyl ether phthalate, diethylene vinyl ether isophthalate, dipropylene vinyl ether phthalate, dipropylene vinyl ether terephthalate, dipropylene vinyl ether isophthalate, diethylene vinyl ether maleate, diethylene vinyl ether fumarate, and diethylene vinyl ether itaconate, and compounds of the formulas (II-1) to (II-11) given below. The alkenyl ether is not limited to the exemplified compounds.

(II-1) 

(II-2) 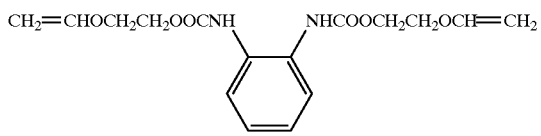

(II-3) 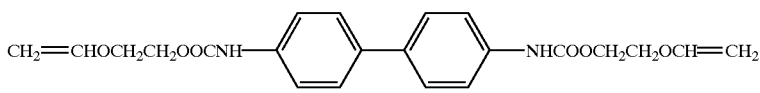

(II-4) 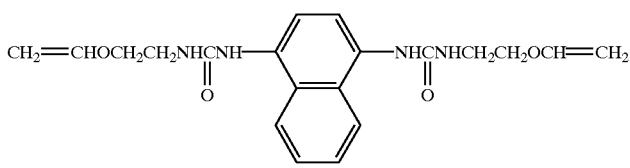

(II-5) 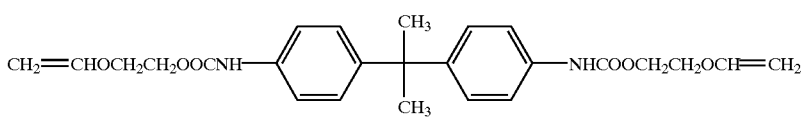

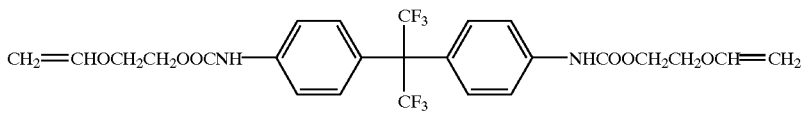
(II-6)

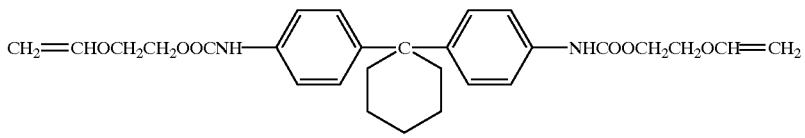
(II-7)

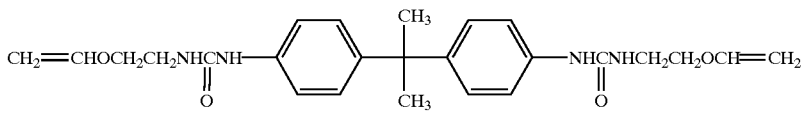
(II-8)

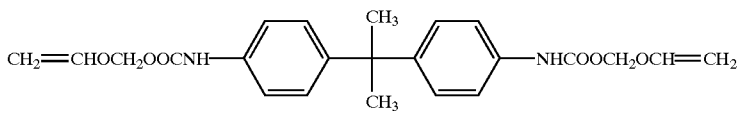
(II-9)

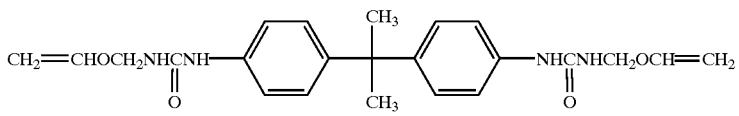
(II-10)

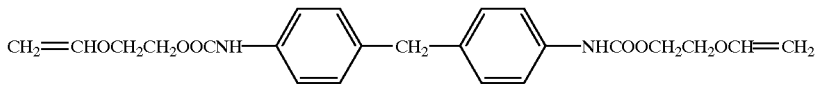
(II-11)

$R^3$ is a straight, branched or cyclic, substituted or unsubstituted, monovalent hydrocarbon group of 1 to 20 carbon atoms. Examples include alkyl, aryl, aralkyl groups and substituted ones of these groups in which some or all of the hydrogen atoms are substituted with halogen atoms.

Illustrative, non-limiting, examples of $R^3$ include straight alkyl groups such as methyl, chloromethyl, ethyl, 2,2,2-trifluoroethyl, n-propyl, 3,3,3-trifluoropropyl; branched alkyl groups such as isopropyl, isobutyl, sec-butyl and tert-butyl; and cyclic alkyl groups such as cyclopropyl, cyclobutyl, cyclopentyl, cyclohexyl, 2-norbornyl, 1-adamantyl and 2-adamantyl, alone or in admixture of two or more in an arbitrary proportion.

In formula (1), suitable groups represented by the following formula (1a):

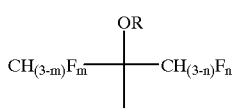
(1a)

are illustrated below.

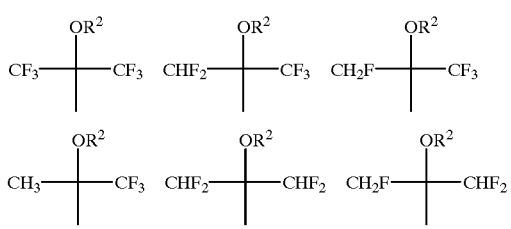

-continued

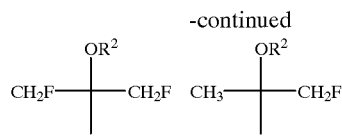

In formulae (1) and (2), letters m and n are in the range: $0 \leq m \leq 3$ and $0 \leq n \leq 3$, preferably m=3 and n=3.

Also in formula (2), p, q, r, s, t and u are in the range: $0<p<1$, preferably $0.05 \leq p \leq 0.95$, more preferably $0.1 \leq p \leq 0.9$, even more preferably $0.15 \leq p \leq 0.85$; and $0<q<1$, preferably $0.05 \leq q \leq 0.95$, more preferably $0.1 \leq q \leq 0.9$, even more preferably $0.15 \leq q \leq 0.85$; and $0 \leq r<1$, $0 \leq s<1$, $0 \leq t<1$, and $0 \leq u<1$, preferably $0 \leq r \leq 0.6$, $0 \leq s \leq 0.6$, $0 \leq t \leq 0.6$, and $0 \leq u \leq 0.6$, more preferably $0 \leq r \leq 0.4$, $0 \leq s \leq 0.4$, $0 \leq t \leq 0.4$, and $0 \leq u \leq 0.4$, even more preferably $0 \leq r \leq 0.2$, $0 \leq s \leq 0.2$, $0 \leq t \leq 0.2$, and $0 \leq u \leq 0.2$, with the proviso that $p+q+r+s+t+u=1$.

The inventive polymer preferably has a weight average molecular weight of about 1,000 to about 100,000, especially about 1,500 to about 50,000.

The polymers are generally prepared according to the synthesis procedure shown below, by synthesizing a trichlorosilane or trialkoxysilane monomer, and effecting hydrolysis reaction and dehydrating polycondensation reaction in a conventional manner for polymerization. The hydroxy group on the fluorinated alcohol is blocked with an acetyl or alkyl group during the polycondensation step, and the blocking group is eliminated after polycondensation. Thereafter, by protecting the hydroxyl group with an acid labile group, that is, partially introducing acid labile groups to substitute for some OH groups, a polymer comprising recurring units of formula (1) is obtained.

Exemplary procedure 1

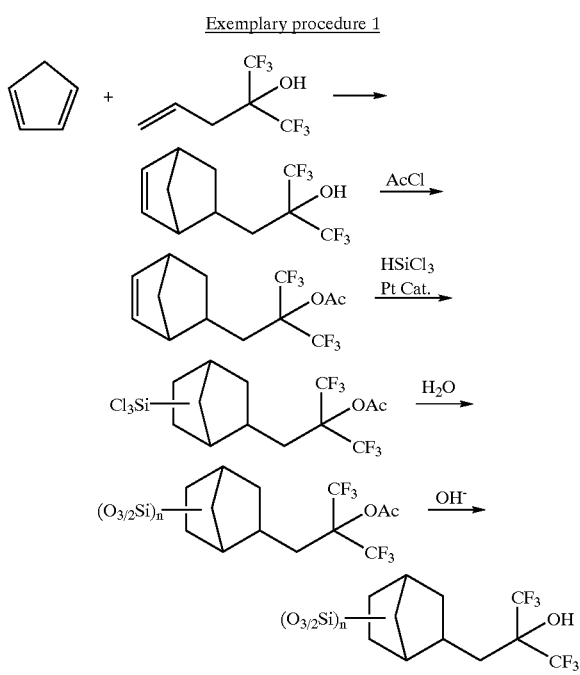

Exemplary procedure 2

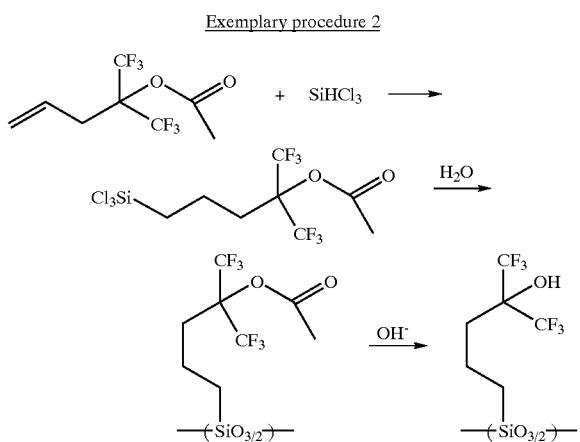

It is possible in formula (2) that q has a value of approximately 1 while r, s, t and u have values of 0 or approximately 0. Under such settings, however, it sometimes becomes impossible or difficult to obtain a polymer having the desired molecular weight and physical properties including thermodynamic properties, depending on the group represented by $R^1$ and the group of formula (1a). Effective means for overcoming such inconvenience is to set appropriate values of r, s, t and u. One exemplary situation is demonstrated later by Synthesis Examples. In Synthesis Example 5, it is difficult to increase the molecular weight of Polymer III above 4,000 as long as the charge composition is kept unchanged. In contrast, Polymer V having a molecular weight in excess of 6,000 is readily obtained in Synthesis Example 7 by setting an appropriate value of t.

The polymers of the invention are useful as the base resin in resist compositions, and among others, chemical amplification type resist compositions, and especially chemical amplification type positive resist compositions.

Resist Composition

The invention also provides a chemical amplification positive resist composition comprising (A) the polymer defined above as a base resin, (B) an organic solvent, and (C) a photoacid generator.

In preferred embodiments, the resist composition may further contain (D) a basic compound and/or (E) a dissolution inhibitor.

Component (B)

The organic solvent used as component (B) in the invention may be any organic solvent in which the photoacid generator, base resin (inventive polymer), dissolution inhibitor, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents may be used alone or in combinations of two or more thereof. Of the above organic solvents, preferred are diethylene glycol dimethyl ether, 1-ethoxy-2-propanol and ethyl lactate, in which the photoacid generator is most soluble, and propylene glycol monomethyl ether acetate which is safe, and mixtures thereof.

Component (C)

Suitable examples of the photoacid generator (C) include onium salts of general formula (7) below, diazomethane derivatives of formula (8), glyoxime derivatives of formula (9), β-ketosulfone derivatives, disulfone derivatives, nitrobenzylsulfonate derivatives, sulfonic acid ester derivatives, and imidoyl sulfonate derivatives.

$$(R^{30})_b M^+ K^-  \qquad (7)$$

In the formula, $R^{30}$ is a straight, branched or cyclic alkyl of 1 to 12 carbon atoms, an aryl of 6 to 12 carbon atoms, or an aralkyl of 7 to 12 carbon atoms; $M^+$ is iodonium or sulfonium; $K^-$ is a non-nucleophilic counter-ion; and the letter b is 2 or 3.

Illustrative examples of alkyl groups represented by $R^{30}$ include methyl, ethyl, propyl, butyl, cyclohexyl, 2-oxocyclohexyl, norbornyl, and adamantyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary aralkyl groups include benzyl and phenethyl. Examples of the non-nucleophilic counter-ion represented by $K^-$ include halide ions such as chloride and bromide; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

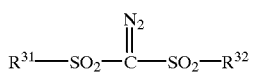
(8)

In the formula, $R^{31}$ and $R^{32}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms.

Illustrative examples of alkyl groups represented by $R^{31}$ and $R^{32}$ include methyl, ethyl, propyl, butyl, amyl, cyclopentyl, cyclohexyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorobenzene, chlorobenzene, and 1,2,3,4,5-pentafluorobenzene. Exemplary aralkyl groups include benzyl and phenethyl.

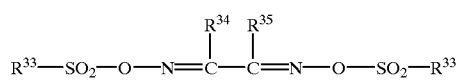
(9)

In the formula, $R^{33}$, $R^{34}$, and $R^{35}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms. $R^{34}$ and $R^{35}$ may together form a cyclic structure with the proviso that if they form a cyclic structure, each is a straight or branched alkylene group of 1 to 6 carbon atoms.

The alkyl, halogenated alkyl, aryl, halogenated aryl, and aralkyl groups represented by $R^{33}$, $R^{34}$, and $R^{35}$ are exemplified by the same groups as mentioned above for $R^{31}$ and $R^{32}$. Examples of alkylene groups represented by $R^{34}$ and $R^{35}$ include methylene, ethylene, propylene, butylene, and hexylene.

Illustrative examples of the photoacid generator include: onium salts such as diphenyliodonium trifluoromethanesulfonate, (p-tert-butoxyphenyl) phenyliodonium trifluoromethanesulfonate, diphenyliodonium p-toluenesulfonate, (p-tert-butoxyphenyl) phenyliodonium p-toluenesulfonate, triphenylsulfonium trifluoromethanesulfonate, (p-tert-butoxyphenyl) diphenylsulfonium trifluoromethanesulfonate, bis(p-tert-butoxyphenyl)phenylsulfonium trifluoromethanesulfonate, tris(p-tert-butoxyphenyl)-sulfonium trifluoromethanesulfonate, triphenylsulfonium p-toluenesulfonate, (p-tert-butoxyphenyl) diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl) sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, and dicyclohexylphenylsulfonium p-toluenesulfonate;

diazomethane derivatives such as bis(benzenesulfonyl) diazomethane, bis(p-toluenesulfonyl)diazomethane, bis (xylenesulfonyl)diazomethane, bis(cyclohexylsulfonyl) diazomethane, bis(cyclopentylsulfonyl)diazomethane, bis (n-butylsulfonyl)diazomethane, bis(isobutylsulfonyl) diazomethane, bis(sec-butylsulfonyl)diazomethane, bis(n-propylsulfonyl)diazomethane, bis(isopropylsulfonyl) diazomethane, bis(tert-butylsulfonyl)diazomethane, bis(n-amylsulfonyl)diazomethane, bis(isoamylsulfonyl) diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane;

glyoxime derivatives such as bis-o-(p-toluenesulfonyl)-α-dimethylglyoxime, bis-o-(p-toluenesulfonyl)-α-diphenylglyoxime, bis-o-(p-toluenesulfonyl)-α-dicyclohexylglyoxime, bis-o-(p-toluenesulfonyl)-2,3-pentanedioneglyoxime, bis-o-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime, bis-o-(tertbutanesulfonyl)-α-dimethylglyoxime, bis-o-(perfluorooctanesulfonyl)-α-dimethylglyoxime, bis-o-(cyclohexanesulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime, and bis-o-(camphorsulfonyl)-α-dimethylglyoxime;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris (methanesulfonyloxy)benzene, 1,2,3-tris (trifluoromethanesulfonyloxy)benzene, and 1,2,3-tris(p-toluenesulfonyloxy)benzene; and imidoyl sulfonate derivatives such as phthalimidoyl triflate, phthalimidoyl tosylate, 5-norbornene-2,3-dicarboxyimidoyl triflate, 5-norbornene-2,3-dicarboxyimidoyl tosylate, and 5-norbornene-2,3-dicarboxyimidoyl n-butylsulfonate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl) sulfonium trifluoromethanesulfonate, triphenylsulfonium p-toluenesulfonate, (p-tert-butoxyphenyl) diphenylsulfonium p-toluenesulfonate, and tris(p-tert-butoxyphenyl)sulfonium p-toluenesulfonate; diazomethane derivatives such as bis(benzenesulfonyl)diazomethane, bis (p-toluenesulfonyl)diazomethane, bis(cyclohexylsulfonyl) diazomethane, bis(n-butylsulfonyl)diazomethane, bis (isobutylsulfonyl)diazomethane, bis(sec-butylsulfonyl)

diazomethane, bis(n-propylsulfonyl)diazomethane, bis(isopropylsulfonyl)diazomethane, and bis(tert-butylsulfonyl)diazomethane; and glyoxime derivatives such as bis-o-(p-toluenesulfonyl)-α-dimethylglyoxime and bis-o-(n-butanesulfonyl)-α-dimethylglyoxime. These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is preferably added in an amount of about 0.2 to 15 parts by weight, and especially about 0.5 to 8 parts by weight, per 100 parts by weight of all the base resins. At less than 0.2 part, the amount of acid generated during exposure would be too small and the sensitivity and resolution be poor, whereas the addition of more than 15 parts would lower the transmittance of the resist and result in a poor resolution.

Component (D)

The basic compound used as component (D) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile. See JP-A 5-232706, 5-249683, 5-158239, 5-249662, 5-257282, 5-289322, and 5-289340.

Examples of suitable basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives. Of these, aliphatic amines are especially preferred.

Examples of suitable primary aliphatic amines include ammonia, methylamine, ethylamine, n-propylamine, isopropylamine, n-butylamine, iso-butylamine, sec-butylamine, tertbutylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tertbutylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, truisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]-piperazine, piperidine ethanol, 1-(2-hydroxyethyl)-pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formulas (10) and (11) may also be included.

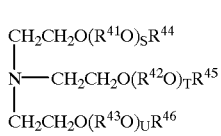
(10)

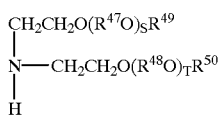
(11)

In the formulas, $R^{41}$, $R^{42}$, $R^{43}$ $R^{47}$ and $R^{48}$ independently straight, branched or cyclic alkylenes of 1 to 20 carbon atoms; $R^{44}$, $R^{45}$, $R^{46}$, $R^{49}$ and $R^{50}$ are hydrogen, alkyls of 1 to 20 carbon atoms, or amino; $R^{44}$ and $R^{45}$, $R^{45}$ and $R^{46}$, $R^{44}$ and $R^{46}$, $R^{44}$ with $R^{45}$ and $R^{46}$, and $R^{49}$ and $R^{50}$ may bond together to form rings; and S, T and U are each integers from 0 to 20, with the proviso that hydrogen is excluded from $R^{44}$, $R^{45}$, $R^{46}$, $R^{49}$ and $R^{50}$ when S, T and U are equal to 0.

The alkylene groups represented by $R^{41}$, $R^{42}$, $R^{43}$, $R^{47}$ and $R^{48}$ preferably have 1 to 20 carbon atoms, more preferably 1 to 10 carbon atoms, and most preferably 1 to 8 carbon atoms. Examples include methylene, ethylene, n-propylene, isopropylene, n-butylene, isobutylene, n-pentylene, isopentylene, hexylene, nonylene, decylene, cyclopentylene, and cyclohexylene.

The alkyl groups represented by $R^{44}$, $R^{45}$, $R^{46}$, $R^{49}$ and $R^{50}$ preferably have 1 to 20 carbon atoms, more preferably 1 to 8 carbon atoms, and most preferably 1 to 6 carbon atoms, and may be straight, branched or cyclic. Examples include methyl, ethyl, n-propyl, isopropyl, n-butyl, isobutyl, tertbutyl, n-pentyl, isopentyl, hexyl, nonyl, decyl, dodecyl, tridecyl, cyclopentyl, and cyclohexyl.

Where $R^{44}$ and $R^{45}$, $R^{45}$ and $R^{46}$, $R^{44}$ and $R^{46}$, $R^{44}$ with $R^{45}$ and $R^{46}$, and $R^{49}$ and $R^{50}$ form rings, the rings preferably have 1 to 20 carbon atoms, more preferably 1 to 8 carbon atoms, and most preferably 1 to 6 carbon atoms, and may have branching alkyl groups of 1 to 6 carbon atoms, and especially 1 to 4 carbon atoms.

S, T, and U are each integers from 0 to 20, preferably from 1 to 10, and more preferably from 1 to 8.

Illustrative examples of the compounds of formulas (10) and (11) include tris{2-(methoxymethoxy)ethyl}amine, tris{2-(methoxyethoxy)ethyl}amine, tris[2-{(2-methoxyethoxy)methoxy}ethyl]amine, tris{2-(2-methoxyethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, and 1-aza-18-crown-6. Especially preferred basic compounds are tertiary amines, aniline derivatives, pyrrolidine derivatives, pyridine derivatives, quinoline derivatives, amino acid derivatives, hydroxyl group-bearing nitrogenous compounds, hydroxyphenyl group-bearing nitrogenous compounds, alcoholic nitrogenous compounds, amide derivatives, imide derivatives, tris{2-(methoxymethoxy)ethyl}amine, tris{2-(2-methoxyethoxy)ethyl}amine, tris[2-{(2-methoxyethoxy)methyl}ethyl]amine, and 1-aza-15-crown-5.

The above-described basic compound may be used singly or in combinations of two or more thereof, and is preferably formulated in an amount of about 0.01 to 2 parts, and especially about 0.01 to 1 part by weight, per 100 parts by weight of all the base resins. At less than 0.01 part, the desired effects of the basic compound would not be apparent, while the use of more than 2 parts would result in too low a sensitivity.

Component (E)

The dissolution inhibitor (E) is a compound with a molecular weight of up to 3,000 which changes its solubility in an alkaline developer under the action of an acid. Typically, a compound obtained by partially or entirely substituting acid labile substituents on a phenol or carboxylic acid derivative having a molecular weight of up to 2,500 is added as the dissolution inhibitor.

Examples of the phenol or carboxylic acid derivative having a molecular weight of up to 2,500 include 4,4'-(1-methylethylidene)bisphenol, (1,1'-biphenyl-4,4'-diol)-2,2'-methylenebis(4-methylphenol), 4,4-bis(4'-hydroxyphenyl) valeric acid, tris(4-hydroxyphenyl)methane, 1,1,1-tris(4'-hydroxyphenyl)ethane, 1,1,2-tris(4'-hydroxyphenyl)ethane, phenolphthalein, thimolphthalein, 3,3'-difluoro[(1,1'-biphenyl)-4,4'-diol], 3,3',5,5'-tetrafluoro[(1,1'-biphenyl)-4,4'-diol], 4,4'-[2,2,2-trifluoro-1-(trifluoromethyl)ethylidene]bisphenol, 4,4'-methylenebis(2-fluorophenol), 2,2'-methylenebis(4-fluorophenol), 4,4'-isopropylidenebis(2-fluorophenol), cyclohexylidenebis(2-fluorophenol), 4,4'-[(4-fluorophenyl)methylene]bis(2-fluorophenol), 4,4'-methylenebis(2,6-difluorophenol), 4,4'-(4-fluorophenyl)methylenebis(2,6-difluorophenol), 2,6-bis[(2-hydroxy-5-fluorophenyl)methyl]-4-fluorophenol, 2,6-bis[(4-hydroxy-3-fluorophenyl)methyl]-4-fluorophenol, and 2,4-bis[(3-hydroxy-4-hydroxyphenyl)methyl]-6-methylphenol. The acid labile substituents are the same as illustrated above for $R^2$.

Illustrative, non-limiting, examples of the dissolution inhibitors which are useful herein include 3,3'-5,5'-tetrafluoro[(1,1'-biphenyl)-4,4'-di-t-butoxycarbonyl], 4,4'-[2,2,2-trifluoro-1-(trifluoromethyl)ethylidene]bisphenol-4,4'-di-t-butoxycarbonyl, bis(4-(2'-tetrahydropyranyloxy)phenyl)methane, bis(4-(2'-tetrahydrofuranyloxy)phenyl)methane, bis(4-tert-butoxyphenyl)methane, bis(4-tert-butoxycarbonyloxyphenyl)methane, bis(4-tert-butoxycarbonylmethyloxyphenyl)methane, bis(4-(1'-ethoxyethoxy)phenyl)methane, bis(4-(1'-ethoxypropyloxy)phenyl)methane, 2,2-bis(4'-(2"-tetrahydropyranyloxy))propane, 2,2-bis(4'-(2"-tetrahydrofuranyloxy)phenyl)propane, 2,2-bis(4'-tert-butoxyphenyl)propane, 2,2-bis(4'-tert-butoxycarbonyloxyphenyl)propane, 2,2-bis(4-tert-butoxycarbonylmethyloxyphenyl)propane, 2,2-bis(4'-(1"-ethoxyethoxy)phenyl)propane, 2,2-bis(4'-(1"-ethoxypropyloxy)phenyl)propane, tert-butyl 4,4-bis(4'-(2"-tetrahydropyranyloxy)phenyl)valerate, tert-butyl 4,4-bis(4'-(2"-tetrahydrofuranyloxy)phenyl)valerate, tert-butyl 4,4-bis(4'-tert-butoxyphenyl)valerate, tert-butyl 4,4-bis(4-tert-butoxycarbonyloxyphenyl)valerate, tert-butyl 4,4-bis(4'-tert-butoxycarbonylmethyloxyphenyl)valerate, tert-butyl 4,4-bis(4'-(1"-ethoxyethoxy)phenyl)valerate, tert-butyl 4,4-bis(4'-(1"-ethoxypropyloxy)phenyl)valerate, tris(4-(2'- tetrahydropyranyloxy)phenyl)methane, tris(4-(2'-tetrahydrofuranyloxy)phenyl)methane, tris(4-tert-butoxyphenyl)methane, tris(4-tert-butoxycarbonyloxyphenyl)methane, tris(4-tert-butoxycarbonyloxymethylphenyl)methane, tris(4-(1'-ethoxyethoxy)phenyl)methane, tris(4-(1'-ethoxypropyloxy)phenyl)methane, 1,1,2-tris(4'-(2"-tetrahydropyranyloxy)phenyl)ethane, 1,1,2-tris(4'-(2"-tetrahydrofuranyloxy)phenyl)ethane, 1,1,2-tris(4'-tert-butoxyphenyl)ethane, 1,1,2-tris(4'-tert-butoxycarbonyloxyphenyl)ethane, 1,1,2-tris(4'-tert-butoxycarbonylmethyloxyphenyl)ethane, 1,1,2-tris(4'-(1'-ethoxyethoxy)phenyl)ethane, 1,1,2-tris(4'-(1'-ethoxypropyloxy)phenyl)ethane, t-butyl 2-trifluoromethylbenzenecarboxylate, t-butyl 2-trifluoromethylcyclohexnecarboxylate, t-butyl decahydronaphthalene-2,6-dicarboxylate, t-butyl cholate, t-butyl deoxycholate, t-butyl adamantanecarboxylate, t-butyl adamantaneacetate, and tetra-t-butyl 1,1'-bicyclohexyl-3,3',4,4'-tetracarboxylate.

In the resist composition according to the invention, an appropriate amount of the dissolution inhibitor (E) is up to about 20 parts, and especially up to about 15 parts by weight per 100 parts by weight of the solids in the composition. With more than 20 parts of the dissolution inhibitor, the resist composition becomes less heat resistant because of an increased content of monomer components.

The resist composition of the invention may include, as an optional ingredient, a surfactant which is commonly used for improving the coating characteristics. Optional ingredients may be added in conventional amounts so long as this does not compromise the objects of the invention.

A nonionic surfactant is preferred, examples of which include perfluoroalkyl polyoxyethylene ethanols, fluorinated alkyl esters, perfluoroalkylamine oxides, and fluorinated organosiloxane compounds. Illustrative examples include Florade FC-430 and FC-431 from Sumitomo 3M Ltd., Surflon S-141, S-145, S-381 and S-383 from Asahi Glass Co., Ltd., Unidyne DS-401, DS-403, and DS-451 from Daikin Industries Ltd., Megaface F-8151, F-171, F-172, F-173 and F-177 from Dainippon Ink & Chemicals, Inc., and X-70-092 and X-70-093 from Shin-Etsu Chemical Co., Ltd. Preferred surfactants include Florade FC-430 from Sumitomo 3M Ltd. and X-70-093 from Shin-Etsu Chemical Co., Ltd.

Pattern formation using the resist composition of the invention may be carried out by a known lithographic technique. For example, the resist composition may be applied onto a substrate such as a silicon wafer by spin coating or the like to form a resist film having a thickness of 0.1 to 1.0 µm, which is then pre-baked on a hot plate at 60 to 200° C. for 10 seconds to 10 minutes, and preferably at 80 to 150° C. for ½ to 5 minutes. A patterning mask having the desired pattern may then be placed over the resist film, and the film exposed through the mask to an electron beam or to high-energy radiation having a wavelength below 300 nm such as deep-UV rays, excimer laser light, or x-rays in a dose of about 1 to 200 mJ/cm$^2$, and preferably about 10 to 100 mJ/cm$^2$, then post-exposure baked (PEB) on a hot plate at 60 to 150° C. for 10 seconds to 5 minutes, and preferably at 80 to 130° C. for ½ to 3 minutes. Finally, development may be carried out using as the developer an aqueous alkali solution, such as 0.1 to 5%, and preferably 2 to 3%, tetramethylammonium hydroxide (TMAH), this being done by a conventional method such as dipping, puddling, or spraying for a period of 10 seconds to 3 minutes, and preferably 30 seconds to 2 minutes. These steps result in the formation of the desired pattern on the substrate. Of the various types of high-energy radiation that may be used, the resist composition of the invention is best suited to micropattern formation with, in particular, deep-UV rays having a wavelength of 254 to 120 nm, an excimer laser, especially ArF excimer laser (193 nm), $F_2$ excimer laser (157 nm), $Kr_2$ excimer laser (146 nm), KrAr excimer laser (134 nm) or $Ar_2$ excimer laser (121 nm), x-rays, or an electron beam. The desired pattern may not be obtainable outside the upper and lower limits of the above range. Thereafter, the pattern as an undercoat is customarily etched with an oxygen plasma to be ready for further processing.

The resist composition comprising the polymer of the invention is sensitive to high-energy radiation, has excellent sensitivity and resolution at a wavelength of less than 200 nm, especially less than 170 nm, and excellent plasma etching resistance. Because these features of the inventive resist composition enable its use particularly as a resist having a low absorption at the exposure wavelength of a $F_2$ excimer laser, a finely defined pattern having sidewalls perpendicular to the substrate can easily be formed, making the resist ideal as a micropatterning material in VLSI fabrication.

EXAMPLE

Examples of the invention are given below by way of illustration and not by way of limitation. The abbreviations used herein are GPC for gel permeation chromatography, NMR for nuclear magnetic resonance, and Mw for weight average molecular weight.

Synthesis Example 1

5-(2-acetoxy-2,2-bistrifluoromethyl)ethyl-2-norbornene

A 200-ml autoclave was charged with 14.9 g of cyclopentadiene and 43.8 g of 1,1-bistrifluoromethyl-3-buten-1-ol, which were stirred for 2 hours at 180° C. The reaction mixture was distilled in vacuum, collecting 19.6 g of 5-(2-hydroxy-2,2-bistrifluoromethyl)ethyl-2-norbornene as a fraction having a boiling point of 84–88° C./3.33 kPa. A 200-ml three-necked flask was charged with 1.9 g of sodium hydride and 90 ml of tetrahydrofuran, to which 18.0 g of the above norbornene derivative in 90 ml of tetrahydrofuran was added dropwise in a careful manner so as to avoid hydrogen evolution. After 30 minutes of stirring at room temperature, under ice cooling, 8.0 g of acetyl chloride was added dropwise over one hour. The reaction mixture was stirred for one hour at room temperature and then poured into an aqueous sodium hydrogen carbonate solution under ice cooling. The aqueous layer was extracted with diethyl ether. The organic layer was washed with saturated saline solution, dried over anhydrous sodium sulfate, filtered, concentrated and distilled in vacuum. By collecting a fraction having a boiling point of 90–94° C./3.33 kPa, 16.6 g of the end compound, 5-(2-acetoxy-2,2-bistrifluoromethyl)ethyl-2-norbornene was obtained. Its identity was confirmed by mass spectroscopy.

Synthesis Example 2

(2-acetoxy-2,2-bistrifluoromethyl)ethyl-trichlorosilylnorbornane

A 100-ml three-necked flask equipped with a stirrer, reflux condenser, dropping funnel and thermometer was charged with 9.0 g of 5-(2-acetoxy-2,2-bistrifluoromethyl)-ethyl-2-norbornene, 0.009 g of a 20 wt % isopropanol solution of chloroplatinic acid, and 15 ml of isooctane and heated at 80° C. Once the internal temperature became constant, 4.3 g of trichlorosilane was added dropwise over 30 minutes. After the completion of dropwise addition, the reaction solution was stirred for 5 hours at 80° C. By vacuum distillation of the reaction solution, 8.2 g of (2-acetoxy-2,2-bistrifluoromethyl)ethyl-trichlorosilylnorbornane was collected as a fraction having a boiling point of 98–102° C./10 Pa.

Synthesis Example 3

Polymer I

A 200-ml, three-necked flask was charged with 8.5 g of triethylamine, 5 ml of toluene, 5 ml of methyl isobutyl ketone and 10 ml of water. Under ice cooling, 5.0 g of the norbornane derivative obtained in Synthesis Example 2 was added dropwise, followed by one hour of stirring at room temperature. The reaction mixture was diluted with methyl isobutyl ketone and repeatedly washed with an aqueous mixture of sodium chloride and ammonium chloride until pH 8 was reached. The reaction mixture was concentrated, and dissolved in toluene and filtered. In a 200-ml, three-necked flask, this was stirred at 200° C. for 12 hours, yielding 4.1 g of a polymer having a Mw of 3,200. The polymer solution was allowed to cool down, to which 7.7 g of potassium carbonate, 45 ml of methanol, 55 ml of tetrahydrofuran and 10 ml of water were added, followed by 12 hours of stirring at room temperature. To the solution were added 50 ml of an aqueous saturated ammonium chloride solution and 10 ml of water. The aqueous layer was extracted with ether, and the organic layer was washed with saturated saline solution, dried over anhydrous sodium sulfate, filtered and concentrated. The concentrate was dissolved in 50 ml of tetrahydrofuran, to which 0.3 g of methanesulfonic acid was added, and 1.3 g of ethyl vinyl ether was further added at 30° C. After 3 hours of stirring, concentrated aqueous ammonia was added for neutralization. The reaction solution was solvent exchanged with ethyl acetate, washed six times with a mixture of distilled water and acetone, solvent exchanged again with acetone, and added dropwise to distilled water. The crystals were collected by filtration, washed with distilled water, and dried in vacuum, obtaining 3.9 g of a white powder. On NMR and GPC analysis, this was confirmed to be a polymer I of the following formula having a Mw of 3,300.

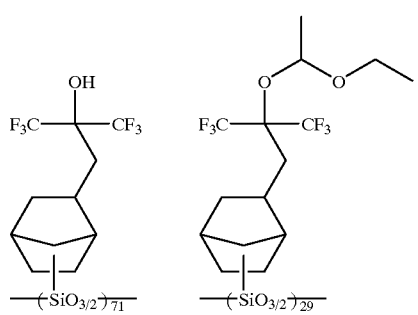

(I)

Synthesis Example 4

Polymer II

The procedure of Synthesis Example 3 was repeated except that 3,4-dihydro-2H-pyran was used instead of ethyl vinyl ether. There was obtained 4.0 g of a polymer II of the following formula having a Mw of 3,400.

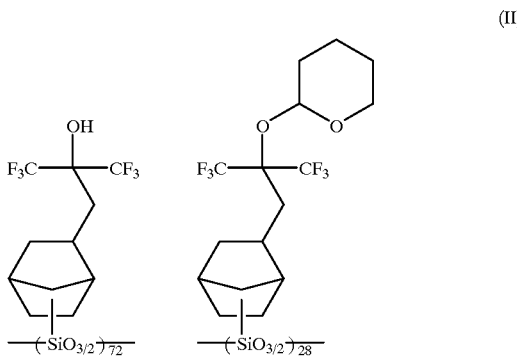

(II)

Synthesis Example 5

Polymer III

A 200-ml, three-necked flask was charged with 8.5 g of triethylamine, 5 ml of toluene, 5 ml of methyl isobutyl ketone and 10 ml of water. Under ice cooling, a mixture of 5.93 g of the norbornane derivative obtained in Synthesis Example 2 and 0.35 g of trichloromethylsilane was added dropwise, followed by one hour of stirring at room temperature. The reaction mixture was diluted with methyl isobutyl ketone and repeatedly washed with an aqueous mixture of sodium chloride and ammonium chloride until pH 8 was reached. The reaction mixture was concentrated, and dissolved in toluene and filtered. In a 200-ml, three-necked flask, this was stirred at 200° C. for 12 hours, yielding 3.91 g of a polymer having a Mw of 3,600. The polymer solution was allowed to cool down, to which 7.5 g of potassium carbonate, 40 ml of methanol, 50 ml of tetrahydrofuran and 10 ml of water were added, followed by 12 hours of stirring at room temperature. To the solution were added 50 ml of an aqueous saturated ammonium chloride solution and 10 ml of water. The aqueous layer was extracted with ether, and the organic layer was washed with saturated saline solution, dried over anhydrous sodium sulfate, filtered and concentrated. The concentrate was dissolved in 50 ml of tetrahydrofuran, to which 0.30 g of methanesulfonic acid was added, and 1.30 g of ethyl vinyl ether was further added at 30° C. After 3 hours of stirring, concentrated aqueous ammonia was added for neutralization. The reaction solution was solvent exchanged with ethyl acetate, washed six times with a mixture of distilled water and acetone, solvent exchanged again with acetone, and added dropwise to distilled water. The crystals were collected by filtration, washed with distilled water, and dried in vacuum, obtaining 3.72 g of a white powder. On NMR and GPC analysis, this was confirmed to be a polymer III of the following formula having a Mw of 3,800.

(III)

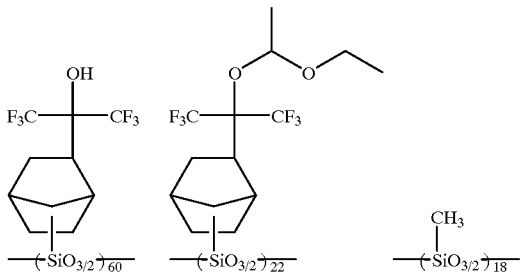

Synthesis Example 6

Polymer IV

The procedure of Synthesis Example 5 was repeated except that 3,4-dihydro-2H-pyran was used instead of ethyl vinyl ether. There was obtained 3.79 g of a polymer IV of the following formula having a Mw of 3,900.

(IV)

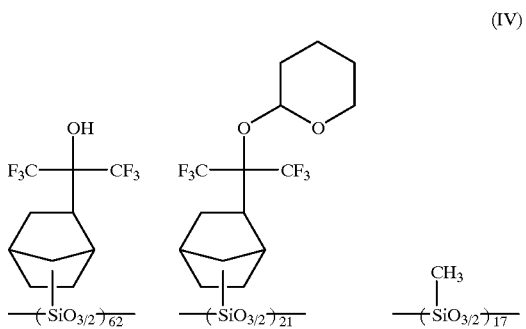

Synthesis Example 7

Polymer V

The procedure of Synthesis Example 5 was repeated except that a mixture of 5.81 g of the norbornane derivative obtained in Synthesis Example 2, 0.43 g of trichloromethylsilane and 0.07 g of 1,2-bis(chlorodimethylsilyl)ethane was used as the reactants to be hydrolyzed. There was obtained 3.89 g of a polymer V of the following formula having a Mw of 6,400.

(V)

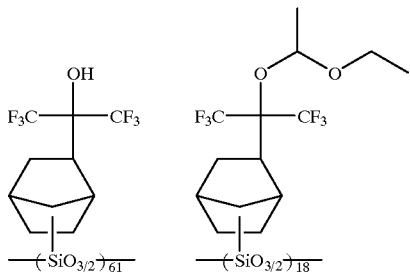

-continued $$-(-SiO_{3/2}-)_{19}-\quad -(-O_{1/2}Si(CH_3)_2CH_2CH_2Si(CH_3)_2O_{1/2}-)_{2}-$$

Comparative Synthesis Example

A reactor was charged with 1,200 ml of water. With stirring at 30° C., a mixture of 487.2 g (2.0 mol) of trichloro-p-methoxybenzylsilane and 600 ml of toluene was added dropwise over 2 hours for effecting hydrolysis. The aqueous layer was separated off, and the organic layer was washed with water until the aqueous layer became neutral. To the organic layer, 80 g of hexamethyldisilazane was added, followed by 5 hours of refluxing. After cooling, the toluene and unreacted hexamethyldisilazane were evaporated off by means of an evaporator, and the residue was dissolved in 400 g of acetonitrile. To the solution below 60° C., 480 g of trimethylsilyl iodide was added dropwise, followed by 10 hours of reaction at 60° C. After the completion of reaction, 200 g of water was added for hydrolysis. By decantation, the polymer layer was separated. The solvent was removed by means of an evaporator, following which the polymer was dried in vacuum, obtaining 330 g of poly(p-hydroxybenzylsilsesquioxane). On GPC analysis, the polymer was found to have a Mw of 3,500.

In a 2-liter flask, 160 g of the above-prepared poly(p-hydroxybenzylsilsesquioxane) was dissolved in 1,000 ml of dimethylformamide, to which a catalytic amount of p-toluenesulfonic acid was added. With stirring at 20° C., 19.0 g of ethyl vinyl ether was added. After one hour of reaction, the reaction solution was neutralized with concentrated aqueous ammonia. The neutralized reaction solution was added dropwise to 10 liters of water, whereupon a white solid matter precipitated. It was filtered and dissolved in 500 ml of acetone, which was added dropwise to 10 liters of water. The solid was filtered and dried in vacuum. On NMR and GPC analysis, this was confirmed to be a polymer VI of the following formula having a Mw of 3,800.

(VI)

The polymers I, II, III, IV, V and VI prepared in Synthesis Example 3, 4, 5, 6, 7 and Comparative Synthesis Example, respectively, were measured for light transmittance by the following procedure. The results are shown in Table 1.

Measurement of Light Transmittance:

Each polymer, 1 g, was thoroughly dissolved in 10 g of propylene glycol monomethyl ether acetate (PGMEA), and passed through a 0.2-μm filter, obtaining a polymer solution. The polymer solution was spin coated onto a MgF$_2$ substrate and baked on a hot plate at 100° C. for 90 seconds, forming a polymer layer of 100 nm thick on the MgF$_2$ substrate. Using a vacuum ultraviolet spectrometer (VUV200S by Nihon Bunko K.K.), the polymer layer was measured for transmittance at 248 nm, 193 nm and 157 nm.

TABLE 1

| Polymer | Transmittance (%) at | | |
|---|---|---|---|
| | 248 nm | 193 nm | 157 nm |
| Polymer I | 93 | 85 | 70 |
| Polymer II | 95 | 87 | 75 |
| Polymer III | 95 | 86 | 70 |
| Polymer IV | 96 | 89 | 74 |
| Polymer V | 94 | 86 | 69 |
| Polymer VI | 85 | 7 | 25 |

Dry Etching Test

Each polymer, 2 g, was thoroughly dissolved in 10 g of propylene glycol monomethyl ether acetate (PGMEA), and passed through a 0.2-μm filter, obtaining a polymer solution. The polymer solution was spin coated onto a Si substrate and baked on a hot plate at 100° C. for 90 seconds, forming a polymer layer of 300 nm thick on the Si substrate. Using a dry etching apparatus TE-8500P by Tokyo Electron K.K., the resist films were etched with oxygen gas under the following conditions.

| | | |
|---|---|---|
| Pressure | 60 | Pa |
| Power | 600 | W |
| Ar | 40 | ml/min |
| O$_2$ | 60 | ml/min |
| Gap | 9 | mm |
| Time | 60 | sec |

The thickness of resist film was measured, from which a difference in resist film thickness before and after the etching was determined.

The results are shown in Table 2.

TABLE 2

| Polymer | O$_2$ gas etching rate (nm/min) |
|---|---|
| I | 92 |
| II | 93 |
| III | 94 |
| IV | 95 |
| V | 91 |
| VI | 110 |

Note:
Polymers I, II, III, IV, V and VI correspond to Synthesis Example 3, 4, 5, 6, 7 and Comparative Synthesis Example, respectively.

Examples and Comparative Examples

Resist solutions were prepared in a conventional manner by formulating the polymer, photoacid generator (PAG1, PAG2), basic compound (TBA, TEA, TMMEA), dissolution inhibitor (DRI) and solvent (PGMEA) in the combination and amounts shown in Table 3.

PAG1

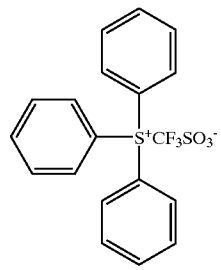

PAG2

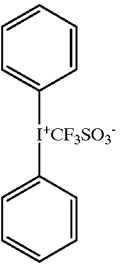

DRI

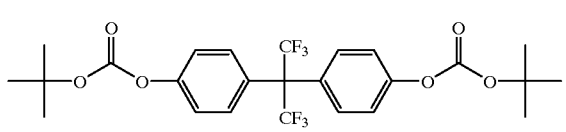

TMMEA

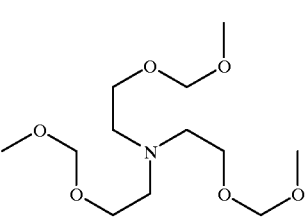

TBA: tributylamine

TEA: triethanolamine

PGMEA: propylene glycol monomethyl ether acetate

On silicon wafers, DUV-30 (Nissan Chemical K.K.) was coated to form films of 55 nm thick so that the reflectance to KrF excimer laser light (248 nm) was reduced below 1%. On the coated substrates, the resist solutions were spin coated, then baked on a hot plate at 100° C. for 90 seconds to give resist films having a thickness of 100 nm.

Using an excimer laser stepper (NSR-S202A, from Nikon Corporation; NA 0.6, σ 0.75, ⅔ Annular illumination), the resist films were exposed. Immediately after exposure, the resist films were baked at 110° C. for 90 seconds and then developed for 30 seconds with a 2.38% aqueous solution of tetramethylammonium hydroxide, obtaining positive patterns.

Resist Pattern Evaluation:

The resist patterns were examined as follows. The optimal dose (Eop, sensitivity: mJ/cm$^2$) was defined as the dose which provided a 1:1 resolution at the top and bottom of a 0.20 μm line-and-space pattern. The resolution of the resist under evaluation was defined as the minimum line width (μm) of the lines and spaces that separated at this dose.

TABLE 3

| Polymer (pbw) | Photoacid generator (pbw) | Basic compound (pbw) | Dissolution inhibitor (pbw) | Solvent (pbw) | Sensitivity (mJ/cm$^2$) | Resolution ($\mu$m) |
|---|---|---|---|---|---|---|
| I (100) | PAG1 (2) | TBA (0.1) | — | PGMEA (1,000) | 30 | 0.18 |
| II (100) | PAG1 (2) | TBA (0.1) | — | PGMEA (1,000) | 20 | 0.18 |
| I (100) | PAG1 (2) | TEA (0.1) | — | PGMEA (1,000) | 32 | 0.18 |
| I (100) | PAG1 (2) | TMMEA (0.1) | — | PGMEA (1,000) | 27 | 0.17 |
| I (100) | PAG2 (2) | TBA (0.1) | — | PGMEA (1,000) | 22 | 0.17 |
| I (100) | PAG1 (2) | TBA (0.1) | DRI (10) | PGMEA (1,000) | 28 | 0.18 |
| III (100) | PAG1 (2) | TBA (0.1) | — | PGMEA (1,000) | 31 | 0.17 |
| IV (100) | PAG1 (2) | TBA (0.1) | — | PGMEA (1,000) | 22 | 0.16 |
| V (100) | PAG1 (2) | TBA (0.1) | — | PGMEA (1,000) | 32 | 0.18 |
| III (100) | PAG1 (2) | TEA (0.1) | — | PGMEA (1,000) | 33 | 0.17 |
| III (100) | PAG1 (2) | TMMEA (0.1) | — | PGMEA (1,000) | 29 | 0.17 |
| III (100) | PAG2 (2) | TBA (0.1) | — | PGMEA (1,000) | 24 | 0.16 |
| III (100) | PAG1 (2) | TBA (0.1) | DRI (10) | PGMEA (1,000) | 30 | 0.16 |
| VI (100) | PAG1 (2) | TBA (0.1) | — | PGMEA (1,000) | 28 | 0.18 |

It is evident from Tables 1 to 3 that the resist compositions using the inventive polymers exhibit a resolution and sensitivity comparable to those of a prior art resist composition of the benzylsilsesquioxane type. The inventive polymers show a less film thickness difference after etching, indicating better dry etching resistance. The inventive polymers have a very high light transmittance in the VUV region. The inventive polymers are thus fully promising in application to F$_2$ or ArF lithography.

Japanese Patent Application Nos. 2000-165884 and 2000-165895 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A polymer comprising recurring units of the following general formula (1):

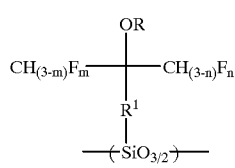

(1)

wherein R$^1$ is a straight, branched or cyclic divalent hydrocarbon group of 1 to 20 carbon atoms or a bridged cyclic hydrocarbon group, R is hydrogen atom or an acid labile group, and letters m and n are in the range: $0 \leq m \leq 3$, $0 \leq n \leq 3$ and $1 \leq m+n \leq 6$.

2. A resist composition comprising the polymer of claim 1.

3. A chemical amplification, positive resist composition comprising
    (A) the polymer of claim 1,
    (B) an organic solvent, and
    (C) a photoacid generator.

4. The resist composition of claim 3 further comprising (D) a basic compound.

5. A resist composition according to claim 4, wherein (D) the basic compound is an aliphatic amine.

6. The resist composition of claim 3 further comprising (E) a dissolution inhibitor.

7. A resist composition according to claim 6, wherein (E) the dissolution inhibitor is an compound with a molecular weight of up to 3000 that changes its solubility in an alkaline developer under the action of an acid.

8. A process for forming a pattern, comprising the steps of:
    applying the resist composition of claim 3 onto a substrate to form a coating,
    heat treating the coating and exposing the coating to high energy radiation with a wavelength of up to 300 nm or electron beam through a photo-mask,
    optionally heat treating the exposed coating, and developing the coating with a developer.

9. A process for forming a multilayer resist pattern, comprising the steps of
    forming a pattern according to the process of claim 8, and
    etching the pattern with an oxygen plasma to be ready for further processing.

10. A polymer according to claim 1, wherein R$^1$ is an alkylene group of 2–16 carbon atoms.

11. A polymer according to claim 1 wherein R$^1$ is methylene, ethylene, propylene butylene, cyclopentylene, or cyclohexylene.

12. A polymer according to claim 1, wherein $R^1$ is

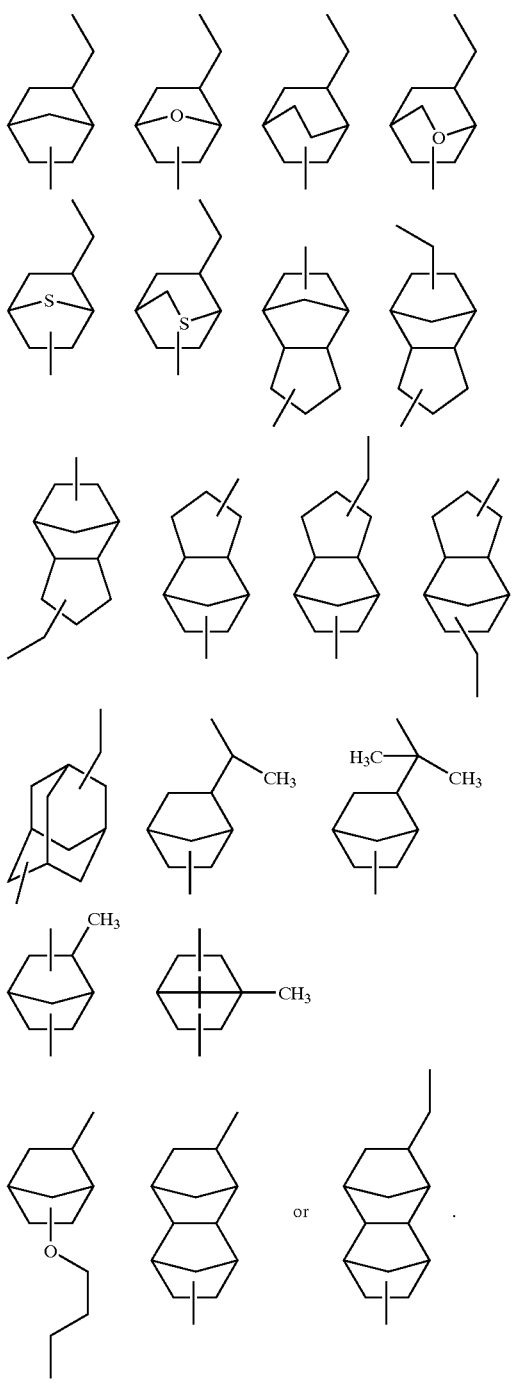

13. A polymer according to claim 1, wherein R is an acid labile group of tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxy-carbonyl, 1-ethylcyclopentyloxycarbonylmethyl, 1-ethyl-2-cyclopentenyloxycarbonyl, 1-ethyl-2-cyclopentenyl-oxycarbonylmethyl, 1-ethyoxyethoxycarbonylmethyl, 2-tetrahydropyranyloxycarbonylmethyl, 2-tetrahydrofuranyloxycarbonylmethyl, ethoxyethyl, butoxyethyl, ethoxypropyl, tert-butyl, triethylcarbyl, 1-ethylnorbornyl, 1-methylcyclohexyl, 1-ethylcyclopentyl, 2-(2-methyl)adamantyl, 2-(2-ethyl)adamantyl, tert-amyl, trimethylsilyl, triethylsilyl, tert-butyldimethylsilyl, or an oxoalkyl of 4–20 carbon atoms.

14. A polymer comprising recurring units of the following general formula (2):

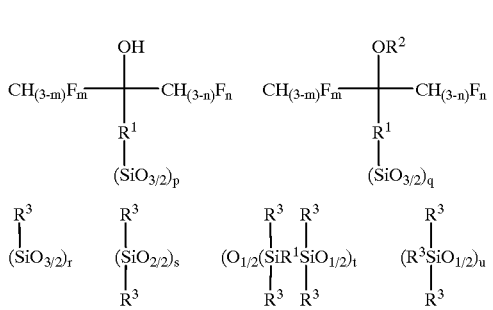

(2)

wherein $R^1$ is a straight, branched, cyclic or bridged cyclic divalent hydrocarbon group of 1 to 20 carbon atoms, $R^2$ is an acid labile group, $R^3$ is a straight, branched or cyclic, substituted or unsubstituted, monovalent hydrocarbon group of 1 to 20 carbon atoms, and letters m, n, p, q, r, s, t, and u are in the range: $0 \leq m \leq 3$, $0 \leq n \leq 3$, $0 < p < 1$, $0 < q < 1$, $0 \leq r < 1$, $0 \leq s < 1$, $0 \leq t < 1$, $0 \leq u < 1$, $1 \leq m+n \leq 6$, and $p+q+r+s+t+u=1$.

15. A resist composition comprising the polymer of claim 14.

16. A chemical amplification, positive resist composition comprising (A) the polymer of claim 14, (B) an organic solvent, and (C) a photoacid generator.

17. A polymer according to claim 14, wherein $R^1$ is an alkylene group of 2–16 carbon atoms.

18. A polymer according to claim 14 wherein $R^1$ is methylene, ethylene, propylene butylenes, cyclopentylene, or cyclohexylene.

19. A polymer according to claim 14, wherein $R^1$ is

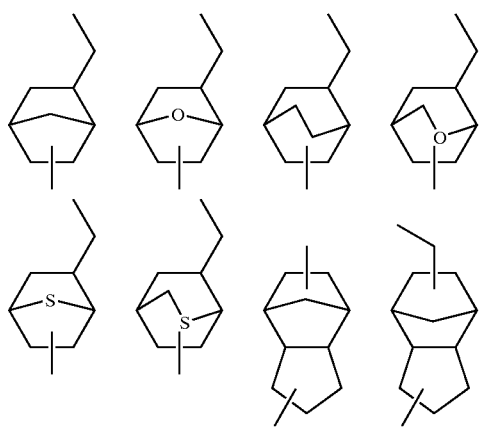

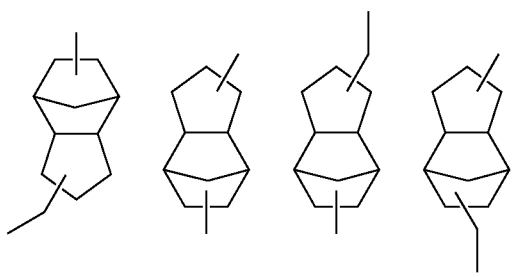
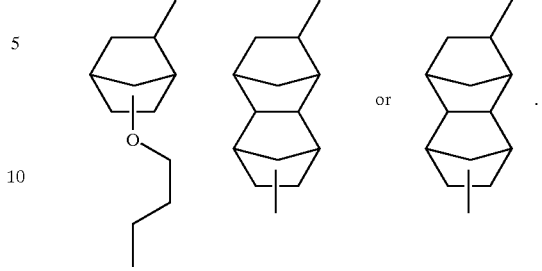
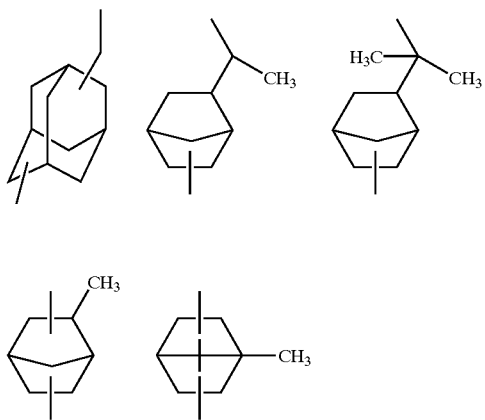

20. A polymer according to claim 14, wherein R is an acid labile group of tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxy-carbonyl, 1-ethylcyclopentyloxycarbonylmethyl, 1-ethyl-2-cyclopentenyloxycarbonyl, 1-ethyl-2-cyclopentenyl-oxycarbonylmethyl, 1-ethyoxyethoxycarbonylmethyl, 2-tetrahydropyranyloxycarbonylmethyl, 2-tetrahydrofuranyloxycarbonylmethyl, ethoxyethyl, butoxyethyl, ethoxypropyl, tert-butyl, triethylcarbyl, 1-ethylnorbornyl, 1-methylcyclohexyl, 1-ethylcyclopenyl, 2-(2-methyl)adamantyl, 2-(2-ethyl)adamantyl, tert-amyl, trimethylsilyl, triethylsilyl, tert-butyldimethylsilyl, or an oxoalkyl of 4–20 carbon atoms.

* * * * *